US012593604B2

(12) United States Patent
Wu et al.

(10) Patent No.: US 12,593,604 B2
(45) Date of Patent: Mar. 31, 2026

(54) ELECTRONIC DEVICE COMPRISING FLEXIBLE SUBSTRATE STRUCTURE HAVING PORTIONS WITH DIFFERENT POISSON RATIOS

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 367 days.

(21) Appl. No.: 18/228,663

(22) Filed: Jul. 31, 2023

(65) Prior Publication Data

US 2024/0081140 A1 Mar. 7, 2024

(30) Foreign Application Priority Data

Sep. 2, 2022 (CN) .......................... 202211073169.0

(51) Int. Cl.
    *H10K 77/10* (2023.01)
(52) U.S. Cl.
    CPC .................................. *H10K 77/111* (2023.02)
(58) Field of Classification Search
    CPC ............ H10K 77/111; H10K 2102/311; H10K 59/12; G06F 1/1656
    See application file for complete search history.

(56) References Cited

U.S. PATENT DOCUMENTS

| | | | |
|---|---|---|---|
| 10,199,323 | B2 | 2/2019 | Hsu |
| 2016/0025344 | A1 | 1/2016 | Bertoldi |
| 2021/0233447 | A1 | 7/2021 | Park |
| 2025/0040409 | A1 * | 1/2025 | He ....................... H10K 77/111 |

FOREIGN PATENT DOCUMENTS

CN 110752232 A 2/2020

OTHER PUBLICATIONS

Lutz, Melanie P., and Robert W. Zimmerman. "The effect of pore shape on the Poisson ratio of porous materials." Mathematics and Mechanics of Solids, vol. 26, No. 8, Jun. 22, 2021, pp. 1191-1203, https://doi.org/10.1177/10812865211023535. (Year: 2021).*

* cited by examiner

*Primary Examiner* — J. E. Schoenholtz
(74) *Attorney, Agent, or Firm* — Winston Hsu

(57) ABSTRACT

The present disclosure provides an electronic device including a covering layer and a flexible substrate structure. The covering layer includes a first region and a second region. The flexible substrate structure is disposed under the covering layer and includes a first portion corresponding to the first region and a second portion corresponding to the second region. A Gaussian curvature of the first region of the covering layer is different from a Gaussian curvature of the second region of the covering layer, and a Poisson's ratio of the first portion of the flexible substrate structure is different from a Poisson's ratio of the second portion of the flexible substrate structure.

9 Claims, 13 Drawing Sheets

ELECTRONIC DEVICE COMPRISING FLEXIBLE SUBSTRATE STRUCTURE HAVING PORTIONS WITH DIFFERENT POISSON RATIOS

BACKGROUND OF THE DISCLOSURE

1. Field of the Disclosure

The present disclosure relates to an electronic device and particularly to an electronic device having a flexible substrate structure with different Poisson's ratios.

2. Description of the Prior Art

Recently, electronic devices have been developed to have a bendable, foldable, or stretchable property, so as to be applied to various objects. However, as appearance design of the object is continuously changed, surfaces of the object may include multiple curved surfaces with different Gaussian curvature, so that a conventional electronic device is not easily disposed on the curved surfaces. Especially, when the electronic device is attached to the surfaces of the object, it is easy to wrinkle. Alternatively, even if a stretchable electronic device may be disposed on the curved surfaces of the object, elements inside the electronic device may be easily damaged, thereby reducing reliability or lifetime of the electronic device.

SUMMARY OF THE DISCLOSURE

According to an embodiment of the present disclosure, an electronic device is provided. The electronic device includes a covering layer and a flexible substrate structure. The covering layer includes a first region and a second region. The flexible substrate structure is disposed under the covering layer and includes a first portion corresponding to the first region and a second portion corresponding to the second region. A Gaussian curvature of the first region of the covering layer is different from a Gaussian curvature of the second region of the covering layer, and a Poisson's ratio of the first portion of the flexible substrate structure is different from a Poisson's ratio of the second portion of the flexible substrate structure.

These and other objectives of the present disclosure will no doubt become obvious to those of ordinary skill in the art after reading the following detailed description of the embodiment that is illustrated in the various figures and drawings.

DETAILED DESCRIPTION

Figure 1:
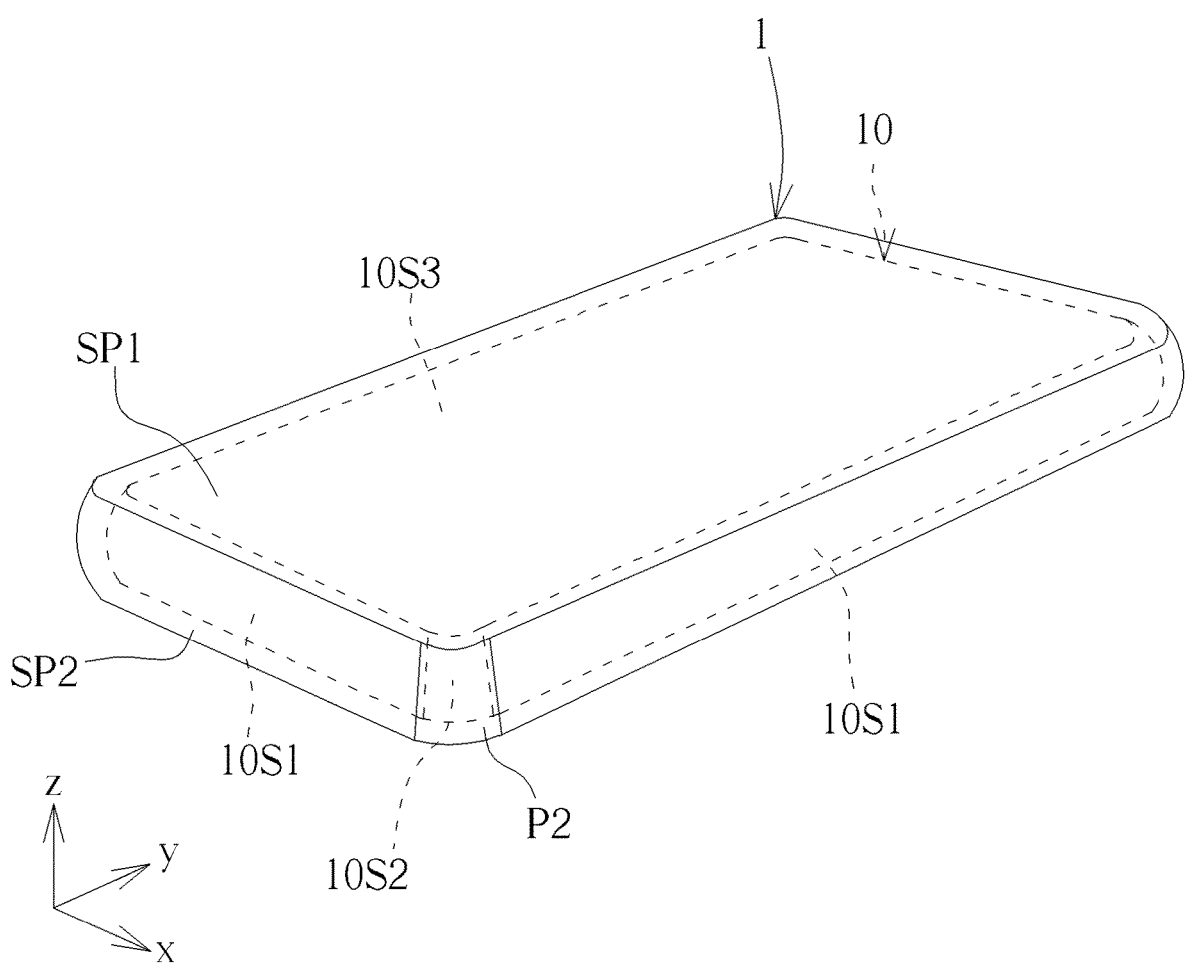
FIG. 1 schematically illustrates a perspective view of an electronic device disposed on an object according to some embodiments of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure.

In addition, when one element or layer is "on" or "above" another element or layer or is "connected to" the another element or layer, it may be understood that the element or layer is directly on the another element or layer or directly connected to the another element or layer, and alternatively, another element or layer may be between the element or layer and the another element or layer (indirectly). On the contrary, when the element or layer is "directly on" the another element or layer or is "directly connected to" the another element or layer, it may be understood that there is no intervening element or layer between the element or layer and the another element or layer. Also, the term "electrically connected" or "coupled" includes means of direct or indirect electrical connection.

As disclosed herein, the terms "approximately", "essentially", "about", or "substantially" generally mean within 10%, 5%, 3%, 2%, 1%, or 0.5% of the reported numerical value or range. The quantity disclosed herein is an approximate quantity, that is, without a specific description of "approximately", "essentially", "about", or "substantially", the quantity may still include the meaning of "approximately", "essentially", "about", or "substantially".

It should be understood that according to the following embodiments, features of different embodiments may be replaced, recombined, or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness, width, or height may be measured by using an optical microscope (OM), a scanning electron microscope (SEM), or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

An electronic device of the present disclosure may be a bendable, stretchable and/or flexible electronic device, but not limited thereto. In the present disclosure, the electronic device may include a light emitting device, a sensing device, a display device, an antenna device, a touch device, a tiled device or other suitable devices, but not limited thereto. The display device may, for example, be applied to a laptop, a public display, a tiled display, a vehicle display, a touch display, a television, a monitor, a smartphone, a tablet, a light source module, a lighting device, or an electronic device applied to the above product, but not limited thereto. The sensing device may be a sensing device used for detecting change in capacitances, light, heat, or ultrasound, but not limited thereto. The sensing device may, for example, include a biometric sensor, a touch sensor, a fingerprint sensor, other suitable sensors, or any combination of sensors mentioned above. The display device may, for example, include a light emitting diode (LED), a quantum dot material, a fluorescent material, a phosphor material, other suitable display mediums, or any combination thereof, but not limited thereto. The LED may, for example, include an organic light emitting diode (OLED), a mini light emitting diode (mini-LED) or a micro light emitting diode (micro-LED), a quantum dot light emitting diode (e.g., QLED or QDLED), other suitable materials, or any combinations of materials mentioned above. The antenna device may, for example, include liquid crystal antenna or antennas of other types, but not limited thereto. The tiled device may, for example, include a tiled display device or a tiled antenna device, but not limited thereto. Furthermore, the appearance of the electronic device may be rectangular, circular, polygonal, a shape with curved edges, curved, or other suitable shapes, but not limited thereto. The electronic device may have peripheral systems such as a driving system, a control system, a light source system, a shelf system, etc. The electronic device may include electronic elements, in which the electronic elements may include a passive element and an active element, and for example include a capacitor, a resistor, an inductor, a diode, a transistor, a sensor, etc. It is noted that the electronic device of the present disclosure may be any combination of the above-mentioned devices, but not limited thereto. The electronic device mentioned in the following contents and drawings is taken as an electronic device with a display function for an example to describe the present disclosure, but the present disclosure is not limited thereto.

Figure 2:
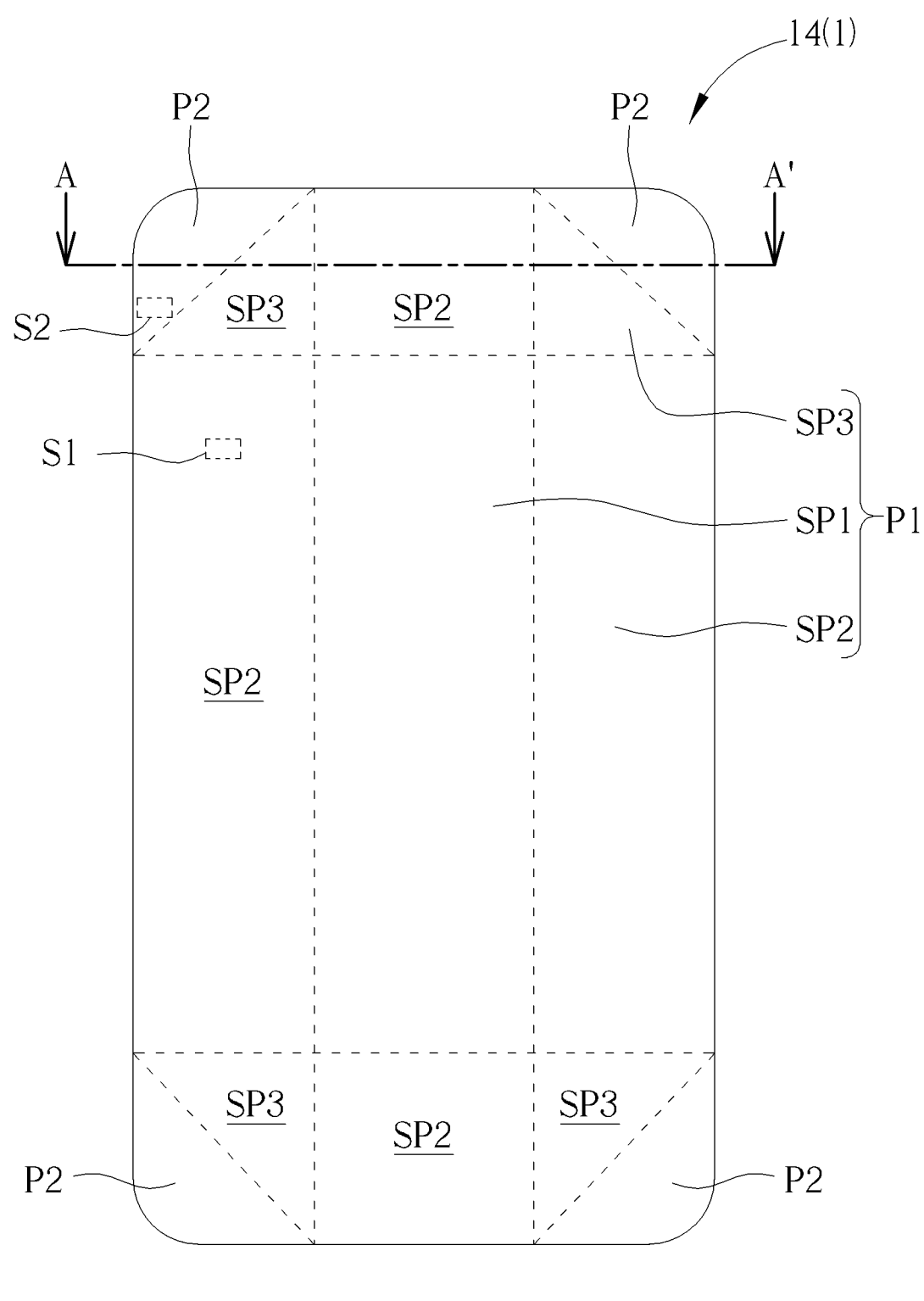
FIG. 2 schematically illustrates the electronic device that is not subjected to external force according to a first embodiment of the present disclosure.
Figure 3:
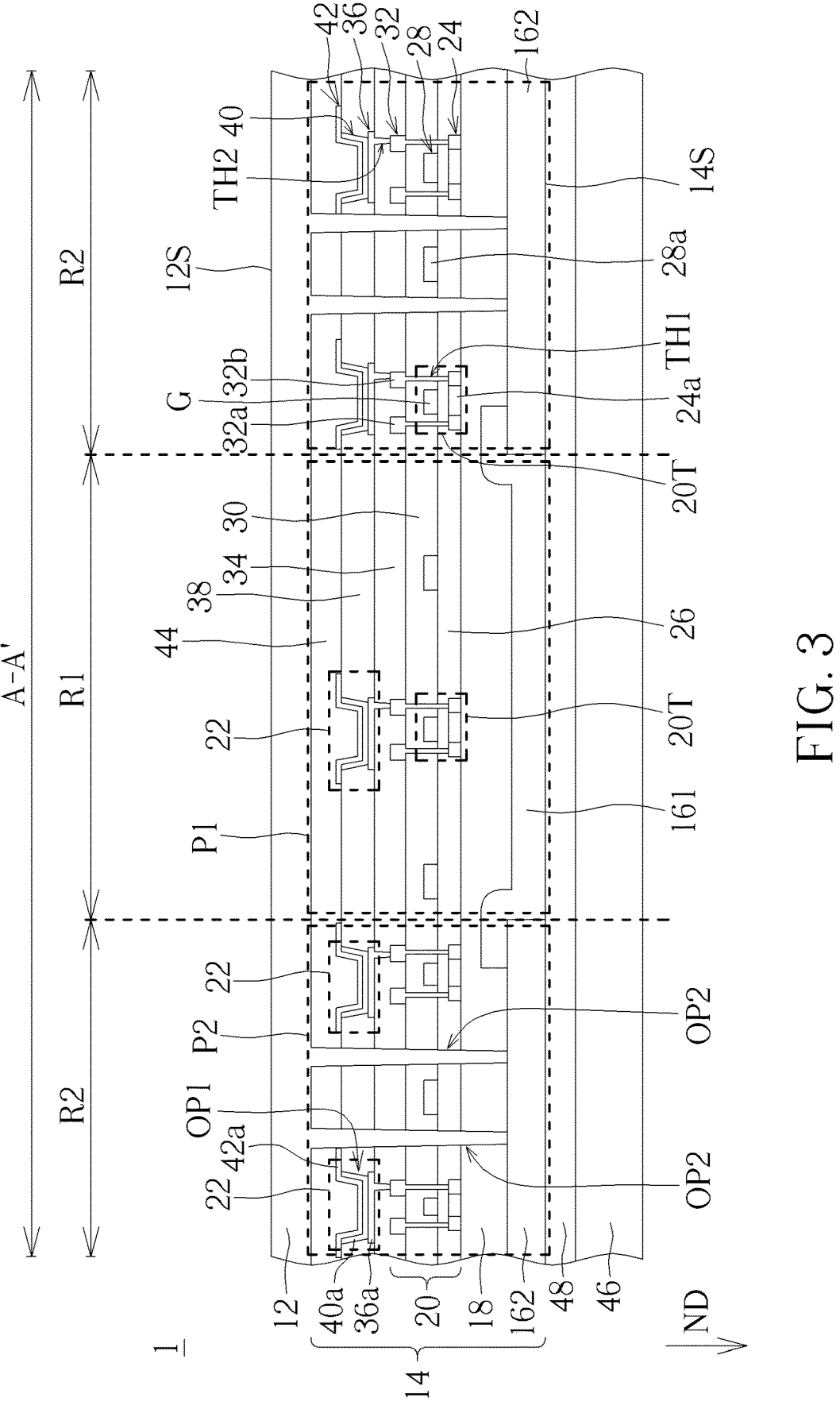
FIG. 3 schematically illustrates a cross-sectional view of the electronic device according to the first embodiment of the present disclosure.

Refer to FIG. 1 to FIG. 3. FIG. 1 schematically illustrates a perspective view of an electronic device disposed on an object according to some embodiments of the present disclosure, FIG. 2 schematically illustrates the electronic device that is not subjected to external force according to a first embodiment of the present disclosure, and FIG. 3 schematically illustrates a cross-sectional view of the electronic device according to the first embodiment of the present disclosure. For example, FIG. 3 may be a schematic cross-sectional view taken along a section line A-A' of FIG. 2. For clarifying drawings, FIG. 3 shows a part of layers and elements of the electronic device, but not limited thereto. As shown in FIG. 1, a surface of the object 10 on which the electronic device 1 is disposed may have different Gaussian curvatures, and the electronic device 1 may be used to be disposed on the surface of the object 10. The term "dispose" mentioned herein may represent that the electronic device 1 is fixed on the surface of the object 10 by assembling, attaching, engaging, locking, or other similar methods, and the term "assembly quality" may represent a degree of conformity or other similar quality of disposing the electronic device 1 on the object 10, but not limited thereto.

In the embodiment of FIG. 1, the object 10 may have at least two surfaces connected to each other (e.g., a side surface 10S1 and a corner surface 10S2 adjacent to a plurality of surfaces), and the at least two surfaces may have different Gaussian curvatures. The object 10 of FIG. 1 may be a power supply device of a mobile device as an example, and the surfaces of the object 10 may include a front surface 10S3, a plurality of side surfaces 10S1 and a plurality of corner surfaces 10S2, wherein the front surface 10S3 may be connected to each side surface 10S1, and one of the corner surfaces 10S2 may be connected between two adjacent side surfaces 1051 and connected to the front surface 10S3, but not limited thereto.

In FIG. 1, a Gaussian curvature of at least one of the corner surfaces 10S2 may be different from a Gaussian curvature of the front surface 10S3 and/or a Gaussian curvature of at least one of the side surfaces 1051. For example, the Gaussian curvature of the front surface 10S3 and/or the Gaussian curvatures of the side surfaces 10S1 may be zero, and the Gaussian curvatures of the corner surfaces 10S2 may be greater than that zero, but not limited thereto. In some embodiments, the Gaussian curvature of the front surface 10S3 and/or the Gaussian curvature of one of the side surfaces 10S1 may be greater than zero, and in this case, the Gaussian curvature of one of the corner surfaces 10S2 may be greater than the Gaussian curvature of the front surface 10S3 and/or the Gaussian curvature of one of the side surfaces 10S1. In some embodiments, the number of surfaces of the object 10 and the corresponding Gaussian curvatures may be adjusted according to appearance requirements of the object 10 and are not limited to the mentioned above. In some embodiments, the electronic device 1 may be disposed on the object 10 to form, for example, a dashboard, a center console, a window and/or a windshield of a vehicle, a wearable device, a mobile device, or other suitable devices. The wearable device may include, for example, a watch, a wristband, glasses, or other suitable devices. The mobile device may include, for example, a mobile phone, or other suitable devices.

A Gaussian curvature mentioned in the present disclosure may be obtained, for example, by using a scanning equipment and a 3D analysis software (such as Geomagic Design X 3D software, or other suitable software, but not limited thereto) for scanning and modeling the surfaces (such as the front surface 10S3, the side surfaces 10S1 and the corner surfaces 10S2), and obtaining an objective Gaussian curvature value of the appearance of the object 10 after analysis.

The present disclosure further provides a method for determining the Gaussian curvature is positive, negative, or zero. A curved surface with a positive Gaussian curvature may be a spherical surface or have a convex shape; a curved surface with a negative Gaussian curvature may have a saddle-like or concave shape; and a surface with a Gaussian curvature of zero may be a plane or a cylindrical surface. The method is to arbitrarily take non-collinear three-point lines on a surface and connect them to form a triangle on the surface, and then determine whether a sum of internal angles of the triangle is greater than 180 degrees, equal to 180 degrees or less than 180 degrees. When the Gaussian curvature of the surface is positive, the sum of the interior angles of the triangle is greater than 180 degrees. When the Gaussian curvature of the surface is negative, the sum of the interior angles of the triangle is less than 180 degrees. When the Gaussian curvature of the surface is zero, the sum of the interior angles of the triangle is equal to 180 degrees. It is noted that in the case of the Gaussian curvature of the surface being of zero, the sum of the internal angles of the triangle may be in a tolerance range from 180 degrees minus 5 degrees to 180 degrees plus 5 degrees ($180°±5°$), but not limited thereto.

Another method in the present disclosure for determining the Gaussian curvature is to arbitrarily take a point on the curved surface, in which the point has two direction vectors orthogonal to each other, and each of the direction vectors has a curvature. A Gaussian curvature of the curved surface is a product of the curvatures of the two direction vectors. When the curvatures of the two directional vectors are positive, the product of the curvatures of the two directional vectors is also positive. When a curve corresponding to one of the directional vectors and a curve corresponding to the other one of the directional vectors are curved in opposite directions, the product of the curvatures of the two directional vectors is negative. When one of the curvatures of two directional vectors is zero, the product of the curvatures of the two directional vectors is zero. By analogy, the Gaussian curvatures of surfaces of other shapes may be determined by the methods mentioned above and are not repeated herein.

In the embodiment of FIG. 1, the connection between the front side 10S3 and one of the side surfaces 10S1 may extend from a plane formed by a direction x and a direction y to a plane formed by the direction x and a direction z (or a plane formed by the direction y and the direction z), so that a part of the front surface 10S3 is adjacent to this side surface 10S1 and a part of this side surface 10S1 adjacent to the front surface 10S3 may be an arc curved surface bent with the direction x (or the direction y) as a bending axis, and the Gaussian curvature of the arc curved surface is zero, but the present disclosure is not limited thereto.

As shown in FIG. 2 and FIG. 3, the electronic device 1 may include a covering layer 12 and a flexible substrate structure 14. The covering layer 12 may include a first region R1 and at least one second region R2, and a Gaussian curvature of the first region R1 of the covering layer 12 may be different from a Gaussian curvature of the second region R2 of the covering layer 12. The flexible substrate structure 14 may be disposed under the covering layer 12 and include a first portion P1 corresponding to the first region R1 and at least one second portion P2 corresponding to the second region R2. The number of the second region R2 and the number of the second portion P2 may be plural in this embodiment, but the present disclosure is not limited thereto. Following contents take one second region R2 and one second portion P2 as an example, but not limited thereto. A Poisson's ratio of the first portion P1 of the flexible substrate structure 14 may be different from a Poisson's ratio of the second portion P2 of the flexible substrate structure 14. Different Poisson's ratios of the flexible substrate structure 14 may improve assembly quality of the electronic device 1 and the object 10, and for example, the electronic device 1 may more conform to the object 10 having at least two surfaces (e.g., one of the side surfaces 10S1 (or the front surface 10S3) and one of the corner surfaces 10S2) with different Gaussian curvatures. In this way, wrinkles or unevenness of the electronic device 1 may be reduced or avoided when the electronic device 1 is disposed on the surface of the object 10, or reliability or lifetime of the electronic device 1 may be improved. In an example of the electronic device 1 having the display function, the electronic device 1 may more conform to the corner surfaces 10S2 and the side surfaces 10S1 of the object 10 (or the corner surfaces 10S2, the side surfaces 10S1 and the front surface 10S3), such that discontinuous or incomplete images displayed by portions of the electronic device corresponding to the corner surfaces 10S2 and the side surfaces 10S1 (or the corner surfaces 10S2, the side surfaces 10S1 and the front surface 10S3) of the object 10 may be reduced, thereby improving visual effect. It should be noted that the first region R1 and the second region R2 of the covering layer 12 may be represented as a first region R1 and a second region R2 of the electronic device 1, respectively. Further, "the portion corresponding to the region" included in the flexible substrate structure 14 herein may be referred to as "the portion" of the flexible substrate structure 14 overlapped with or at least partially overlapped with "the region" of the covering layer 12 in a normal direction ND of the flexible substrate structure 14. In other words, the first portion P1 of this embodiment may be overlapped with the first region R1, and the second portion P2 may be overlapped with the second region R2, but not limited thereto. The meaning of the term "corresponding" mentioned above may be applied to any one of following embodiments of the present disclosure and will not be repeated. In this embodiment, the method for measuring or obtaining the Gaussian curvatures of the first region R1 and the second region R2 of the covering layer 12 may refer to the methods as mentioned above to measure an outer surface 12S (i.e., a surface of the electronic device 1 adjacent to a user) of the covering layer 12 in the first region R1 and the second region R2 away from the flexible substrate structure 14 and are not detailed redundantly.

In the present disclosure, the Poisson's ratio may be calculated by a formula (1): $v=\varepsilon y/\varepsilon x$, where v is the Poisson's ratio, $\varepsilon x$ is a deformation of the object subjected to a force in a first direction, $\varepsilon y$ is a deformation of the object subjected to the force in a second direction, and the first direction and the second direction may be perpendicular to each other. Specifically, when the object subjected to the force in the first direction has the deformation $\varepsilon x$, the object will produce the deformation $\varepsilon y$ in the second direction, and the Poisson's ratio is a ratio of the deformation $\varepsilon y$ to the deformation $\varepsilon x$. In the present disclosure, when the force acted on the object is a tensile force, such that a length of the object in the first direction increases, the Poisson's ratio of the object may be positive if a width of the object in the second direction decreases; the Poisson's ratio may be negative if the width of the object in the second direction increases; and, the Poisson's ratio of the object may be zero if the width of the object in the second direction does not change. In other words, in the case of the Poisson's ratio of the object less than zero, when the object is stretched in the first direction, the width of the object in the second direction will be increased. In some embodiments, the first direction and the second direction may be interchangeable with each other. The object herein may be, for example, at least a portion of any region of the electronic device 1.

In this embodiment, an absolute value of the Gaussian curvature of the first region R1 of the covering layer 12 may be less than an absolute value of the Gaussian curvature of the second region R2 of the covering layer 12, and the Poisson's ratio of the first portion P1 of the flexible substrate structure 14 may be greater than the Poisson's ratio of the second portion P2 of the flexible substrate structure 14. For example, the Gaussian curvature of the first region R1 may be zero, and the Gaussian curvature of the second region R2 may be greater than zero (or less than zero). In this case, the Poisson's ratio of the first portion P1 may be greater than zero, and the Poisson's ratio of the second portion P2 may be less than zero, such that a width of the second portion P2 in the second direction may be increased after the second portion P2 is stretched along the first direction perpendicular to the second direction. Accordingly, a greater deformation may be achieved while reducing damage to the flexible substrate structure 14, but the present disclosure is not limited thereto. In some embodiments, the Gaussian curvature of the first region R1 may not be zero, and its absolute value may be less than the absolute value of the Gaussian curvature of the second region R2.

In FIG. 2, in order to clearly show positions of portions of the flexible substrate structure 14 of the electronic device 1 that are not subjected to the force when viewed along a top view direction, different portions of the flexible substrate structure 14 are shown, and the covering layer 12 of the electronic device 1 is omitted, but not limited thereto. When the flexible substrate structure 14 is not subjected to the force, the top view direction of the flexible substrate structure 14 is, for example, parallel to the normal direction ND of the flexible substrate structure 14, wherein the normal direction ND of FIG. 2 may, for example, be parallel to the direction z of FIG. 1. Specifically, in the embodiment of FIG. 2, when the flexible substrate structure 14 is not subjected to and stretched by the force, the first portion P1 may include a first sub-portion SP1 and a plurality of second sub-portions SP2 while viewed along the normal direction ND of the flexible substrate structure 14. One of the second sub-portions SP2 may be disposed on one side of the first sub-portion SP1 and connected to the first sub-portion SP1, and one of the second portions P2 may be disposed at a corner of the flexible substrate structure 14, that is, located on an outer side of a corner of the first sub-portion SP1 (i.e., away from a center of the first sub-portion SP1). In FIG. 2, the first portion P1 may further include a plurality of third sub-portions SP3, each of which is disposed between two adjacent second sub-portions SP2 and located between one of the second portions P2 and one of the second sub-portions SP2, such that one of the second portions P2 is located on a side of one of the third sub-portions SP3 away from the first sub-portion SP1, but not limited thereto.

As shown in FIG. 1 and FIG. 2, the first sub-portion SP1 may correspond to the front surface 10S3 of the object 10. An area of the first sub-portion SP1 may be, for example, the same as or similar to an area of the front surface 10S3 of the object 10. In some embodiments, before being stretched by a force, the area of the first sub-portion SP1 may be less than the area of the front surface 10S3 of the object 10, for example. The second sub-portions SP2 may respectively correspond to the side surfaces 10S1 of the object 10 by bending boundaries between the first sub-portion SP1 and the second sub-portions SP2. The area of one of the second sub-portions SP2 may be, for example, the same as or similar to the area of one of the side surfaces 10S1 of the object 10. In some embodiments, before being stretched by the force, the area of one of the second sub-portions SP2 may be, for example, less than the area of one of the side surfaces 10S1 of the object 10. One of the third sub-portions SP3 and one of the second portions P2 may correspond to one of the corner surfaces 10S2. Since the Poisson's ratio of one of the second portions P2 may be less than zero, a width of one of the second portions P2 in a direction perpendicular to the direction z may be increased by stretching this second portion P2 along another direction opposite to the direction z when this second portion P2 is disposed (e.g., assembled and/or attached) on one of the corner surfaces 10S2 with the Gaussian curvature greater than zero, such that one of the third sub-portions SP3 and one of the second portions P2 may cover one of the corner surfaces 10S2 more completely, but not limited thereto. In some embodiments, the first portion P1 may not include at least one third sub-portion SP3, such that at least one of the second portions P2 may be located between two adjacent second sub-portions SP2. In this case, one of the second portions P2 may cover one of the corner surfaces 10S2 of the object 10.

As shown in FIG. 1 to FIG. 3, the covering layer 12 may be the outermost structure of the electronic device 1. The Gaussian curvatures of the first region R1 and the second regions R2 of the covering layer 12 may be obtained by measuring a Gaussian curvature of the outer surface 12S of the covering layer 12 when the electronic device 1 is still disposed on the object 10. The method of obtaining the Gaussian curvature of the outer surface 12S of the covering layer 12 may be, for example, the same as the methods of obtaining the Gaussian curvature of the surface of the object 10 described above, so it will not be repeated herein. Through the measured Gaussian curvature, the first region R1 and the second regions R2 of the covering layer 12 (or the electronic device 1) may be defined. In this embodiment, the covering layer 12 may be, for example, a package layer to protect layers and elements in the flexible substrate structure 14 and/or layers and elements between the flexible substrate structure 14 and the covering layer 12. The package layer may include, for example, an organic material or other suitable materials, but the present disclosure is not limited thereto.

In some embodiments, the covering layer 12 may include, for example, a rigid cover structure that may serve as the outermost structure of the electronic device 1. In this case, the covering layer 12 may further include a package layer disposed between the cover structure and the flexible substrate structure 14 and used to protect the layers and elements in the flexible substrate structure 14 and/or layers and elements between the flexible substrate structure 14 and the package layer. The package layer may be disposed on an inner surface of the cover structure, for example, by an adhesive layer, but not limited thereto. The cover structure may include, for example, glass or other suitable materials, but not limited thereto.

As shown in FIG. 3, in this embodiment, the first portion P1 of the flexible substrate structure 14 may include a first substrate 161, and one of the second portions P2 of the flexible substrate structure 14 may include a second substrate 162. Also, the first substrate 161 may be different from the second substrate 162 in material, such that the Poisson's ratio of the first portion P1 may be different from the Poisson's ratio of one of the second portions P2.

For example, in the case where the absolute value of the Gaussian curvature of the first region R1 is less than the absolute value of the Gaussian curvature of one of the second regions R2, the Poisson's ratio of the first substrate 161 may be greater than the Poisson's ratio of the second substrate 162. In some embodiments, the first substrate 161 may have a Poisson's ratio greater than zero, and the second substrate 162 may have a Poisson's ratio less than zero, such that the Poisson's ratio of the first portion P1 may be greater than zero, and the Poisson's ratio of one of the second portions P2 may be less than zero. The first substrate 161 may include, for example, a first flexible substrate material with a Poisson's ratio greater than zero. The first flexible substrate material with the Poisson's ratio greater than zero may include, for example, polyimide (PI), polycarbonate (PC), polyethylene terephthalate (PET), poly(methyl methacrylate) (PMMA), rubber, acrylonitrile butadiene styrene (ABS), other suitable materials, or any combination thereof. The second substrate 162 may include, for example, a second flexible substrate material with a Poisson's ratio less than zero. The second flexible substrate material may include, for example, an auxetic material (Auxetische materialien), wherein the auxetic material may include, for example, graphene or other suitable materials. The second substrate 162 may be, for example, a stretchable substrate, but not limited thereto. In some embodiments, the first substrate 161 and/or the second substrate 162 may be, for example, a single-layer or multilayer structure, but the present disclosure is not limited thereto.

In some embodiments, the Gaussian curvatures of different sub-regions in one of the second regions R2 may differ from each other, so that one of the second portions P2 of the flexible substrate structure 14 may be divided into different sub-portions, and the Poisson's ratio of the sub-portions may be selectively adjusted with distribution of the Gaussian curvatures of the sub-regions of the second region R2. For example, when an absolute value of the Gaussian curvature of one of the sub-regions in the second region R2 is greater, the Poisson's ratio of one of the sub-portions in the second portion P2 corresponding to the sub-region with greater absolute value of the Gaussian curvature is less. That is to say, when the Poisson's ratio of the second portion P2 is negative and less, the absolute value of the Poisson's ratio is greater. Similarly, in some embodiments, the Gaussian curvatures of different sub-regions in the first region R1 may be optionally different from each other, so that the Poisson's ratios of different sub-portions in the first portion P1 may be adjusted to be different with the distribution of the Gaussian curvatures of different sub-regions in the first region R1. For example, when the Gaussian curvature of one of the sub-regions in the first region R1 is less, the Poisson's ratio of one of the sub-portions in the first portion P1 corresponding to the sub-region with greater absolute value of the Gaussian curvature. For example, different sub-portions in the first portion P1 and/or the second portions P2 that have different Poisson's ratios may be obtained by designing substrate materials of different sub-portions to have different Poisson's ratios or adopting the method of following other embodiments, but not limited thereto.

In some embodiments, in the case where the absolute value of the Gaussian curvature of the first region R1 is less than the absolute value of the Gaussian curvature of one of the second regions R2, and the Poisson's ratio of the first portion P1 is greater than the Poisson's ratio of one of the second portions P2, the Poisson's ratios of the first portion P1 and the second portion P2 may be greater than zero. For example, the first substrate 161 and the second substrate 162 may both include the first flexible substrate material with the Poisson's ratio greater than zero, and by selecting the Poisson's ratio of the first flexible substrate material of the second substrate 162 to be less than the Poisson's ratio of the first flexible substrate material of the first substrate 161, reduction of the width of the second portion P2 in the second direction after being stretched along the first direction may be less than that of the first portion P1, thereby reducing the deformation of one of the second portions P2 in the second direction after being stretched. Accordingly, in an application of display, image distortion of the second portion P2 may be reduced, or aspect ratio of images displayed by the second portion P2 may be more uniform. For example, the first substrate 161 may include PET, and the second substrate 162 may include PMMA, but not limited thereto.

As shown in FIG. 3, in the normal direction ND, the first substrate 161 and the second substrate 162 may be partially overlapped with each other at a junction thereof to lower separation of the first substrate 161 and the second substrate 162. In the embodiment of FIG. 3, a part of the first substrate 161 may be extended to be on the second substrate 162, but not limited thereto. In some embodiments, the first substrate 161 and the second substrate 162 may be connected to each other at the junction thereof instead of being overlapped with each other.

In the embodiment of FIG. 3, the first portion P1 and the second portions P2 of the flexible substrate structure 14 may further include an insulating layer 18, a circuit layer 20, and a plurality of electronic elements 22, wherein the insulating layer 18 may be disposed on the first substrate 161 and the second substrate 162, the circuit layer 20 may be disposed on the insulating layer 18, and the electronic elements 22 may be disposed on the circuit layer 20 and coupled to the circuit layer 20.

In some embodiments, the insulating layer 18 is disposed between the first substrate 161 and the circuit layer 20 (or the electronic elements 22) and between the second substrate 162 and the circuit layer 20 (or the electronic elements 22). The insulating layer 18 may, for example, serve as a buffer layer of the electronic device 1 to reduce damage to the circuit layer 20 and/or the electronic elements 22 caused by moisture and/or oxygen passing through the first substrate 161 and/or the second substrate 162.

The circuit layer 20 may include wires, insulating layers, active elements and/or passive elements. For example, the circuit layer 20 may further include a plurality of transistors 20T, and at least one of the transistors 20T may be coupled to at least one of the electronic elements 22 and serve as a driving element and/or a switching element of the electronic element 22, but not limited thereto. In FIG. 3, the electronic elements 22 may be respectively coupled to the corresponding transistors 20T, but not limited thereto. In the circuit layer 20 of FIG. 3, the transistor 20T is taken as an example of a top-gate thin film transistor and may include a semiconductor 24a and a gate G, but not limited thereto. In this case, the circuit layer 20 may include a semiconductor layer 24, an insulating layer 26, a conductive layer 28, an insulating layer 30 and a conductive layer 32. The semiconductor layer 24 may be disposed on the insulating layer 18 and include a plurality of semiconductors 24a, wherein two ends of one of the semiconductors 24a may be doped with dopant, so as to respectively serve as a source region and a drain region, and a portion of the semiconductor 24a located between the source region and the drain region may serve as a channel region of the transistor 20T. A material of the semiconductor layer 24 includes, for example, silicon or metal oxide, such as low temperature polysilicon (LTPS) semiconductor or amorphous silicon (a-Si) semiconductor, indium gallium zinc oxide (IGZO) semiconductor or other suitable semiconductors, but not limited thereto. In some embodiments, the semiconductors 24a of different transistors 20T may include different materials, for example, the semiconductor 24a of one of the transistors 20T includes LTPS, and the semiconductor 24a of another of the transistors 20T includes metal oxide semiconductor, but not limited thereto. The insulating layer 26 may be disposed on the insulating layer 18 and the semiconductor layer 24 and may serve as a gate insulating layer of one of the transistors 20T. The conductive layer 28 may be disposed on the insulating layer 26 and may include a plurality of gates G, and the gates G may be respectively disposed corresponding to the channel regions of the semiconductors 24a of the transistors 20T. In some embodiments, the conductive layer 28 may optionally include electrodes 28a, signal lines (such as scan lines) or other conductive elements, but not limited thereto.

The insulating layer 30 may be disposed on the conductive layer 28 and the insulating layer 26, and the insulating layer 26 and the insulating layer 30 may have a plurality of through holes TH1 corresponding to the source regions and the drain regions of the semiconductors 24a, respectively. The conductive layer 32 may be disposed on the insulating layer 30 and includes a plurality of electrodes 32a and a plurality of electrodes 32b, and one of the electrodes 32a and one of the electrodes 32b may be respectively coupled to the source region and the drain region of the corresponding semiconductor 24a through the corresponding through holes TH1. In some embodiments, the conductive layer 32 may optionally include electrodes, signal lines (such as data lines) or other conductive elements, but not limited thereto. The conductive layer 28 and the conductive layer 32 may include metal or other suitable conductive materials. It should be noted that a structure of the circuit layer 20 shown in FIG. 3 is as an example, and the present disclosure is not limited thereto.

As shown in FIG. 3, the flexible substrate structure 14 may further include an insulating layer 34 disposed between the circuit layer 20 and the electronic elements 22. The insulating layer 34 may be, for example, a planarization layer that is used to improve yield of forming the electronic elements 22, but not limited thereto. Specifically, the insulating layer 34 may be disposed on the conductive layer 32 and the insulating layer 30 and may have a plurality of through holes TH2, such that the electronic elements 22 may be coupled to the corresponding transistors 20T through the corresponding through holes TH2.

One of the electronic elements 22 in this embodiment may include a light emitting element, such as a light emitting diode, but not limited thereto. Further, the first portion P1 and the second portions P2 of the flexible substrate structure 14 may include an insulating layer 38, wherein the insulating layer 38 may have a plurality of openings OP1, and the electronic elements 22 may be respectively disposed corresponding to the openings OP1. For example, the openings OP1 may be used to define positions of pixels or sub-pixels of the electronic device 1, and the insulating layer 38 may be called a pixel defining layer, but not limited thereto. In some embodiments, the electronic elements 22 may include optical sensors, blood oxygen detectors, heartbeat detectors, blood pressure detectors, diodes, other suitable elements or any combination of the above elements, the present disclosure is not limited thereto.

In the embodiment of FIG. 3, a structure of one of the electronic elements 22 is described by taking the electronic element 22 as an organic light emitting diode for an example, but not limited thereto. The electronic element 22 may include the conductive layer 36, the insulating layer 38, the light emitting layer 40 and the conductive layer 42 sequentially disposed on the insulating layer 34, but not limited thereto. The conductive layer 36 may include a plurality of lower electrodes 36a. The insulating layer 38 may be disposed on the insulating layer 34, and the openings OP1 may be respectively disposed corresponding to the lower electrodes 36a, in which each of the openings OP1 may expose at least a part of the corresponding lower electrode 36a. The light emitting layer 40 may include a plurality of light emitting blocks 40a respectively disposed corresponding to the lower electrodes 36a, and at least a part of one of the light emitting blocks 40a is disposed in one of the openings OP1. The conductive layer 42 may be disposed on the light emitting layer 40 and the insulating layer 38 and include a plurality of upper electrodes 42a. The upper electrodes 42a may be respectively disposed on the corresponding light emitting blocks 40a, such that one of the lower electrodes 36a, one of the light emitting blocks 40a and one of the upper electrodes 42a sequentially staked may form one of the electronic elements 22, but the structure of the electronic element 22 in the present disclosure is not limited to the structure shown in FIG. 3 and may be adjusted according to the requirements.

As shown in FIG. 3, the flexible substrate structure 14 may further include an insulating layer 44 disposed on the insulating layer 38 and the conductive layer 42 to protect the electronic elements 22 and the circuit layer 20 disposed under the electronic elements 22. In the embodiment of FIG. 3, one of the second portions P2 may have at least one opening OP2 penetrating through the insulating layer 44, the insulating layer 38, the insulating layer 34, the circuit layer 20 and the insulating layer 18, so as to improve stretchability of the second portion P2. When the covering layer 12 includes a package layer, a portion of the covering layer 12 may be disposed in the opening OP2. In some embodiments, the second portion P2 may not have the opening OP2.

In some embodiments, the insulating layer 44, the insulating layer 38, the insulating layer 34, the insulating layer 30, the insulating layer 26, and the insulating layer 18 may include a single-layer structure or a multilayer structure and may include any suitable organic or inorganic material. The organic material may, for example, include PMMA, epoxy, siloxane material, silica gel material, other suitable materials, or any combination of the above materials. The inorganic material may include silicon nitride, silicon oxide, liquid glass, glass glue, titanium oxide, aluminum oxide, other suitable materials or any combination of the above materials. In some embodiments, when the insulating layer 44, the insulating layer 38, the insulating layer 34, the insulating layer 30, the insulating layer 26, and the insulating layer 18 are multi-layer structures, each of them may include a stacked structure of multiple layers of inorganic materials or multiple layers of organic materials, or a structure of the inorganic materials and the organic materials stacked alternately, and the present disclosure is not limited thereto. In some embodiments, the flexible substrate structure 14 may include different layers and different elements according to distinct types of the electronic device 1.

In the embodiment of FIG. 3, the electronic device 1 may further include a flexible layer 46 and an adhesive layer 48, and the flexible layer 46 may be attached to a lower surface 14S of the flexible substrate structure 14 opposite to the covering layer 12 through the adhesive layer 48, so as to improve strength and/or rigidity of the flexible substrate structure 14. The flexible layer 46 may include a flexible material, such as polyvinyl chloride (PVC), polyethylene (PE), rubber, other suitable materials, or any combination thereof.

Figure 4:
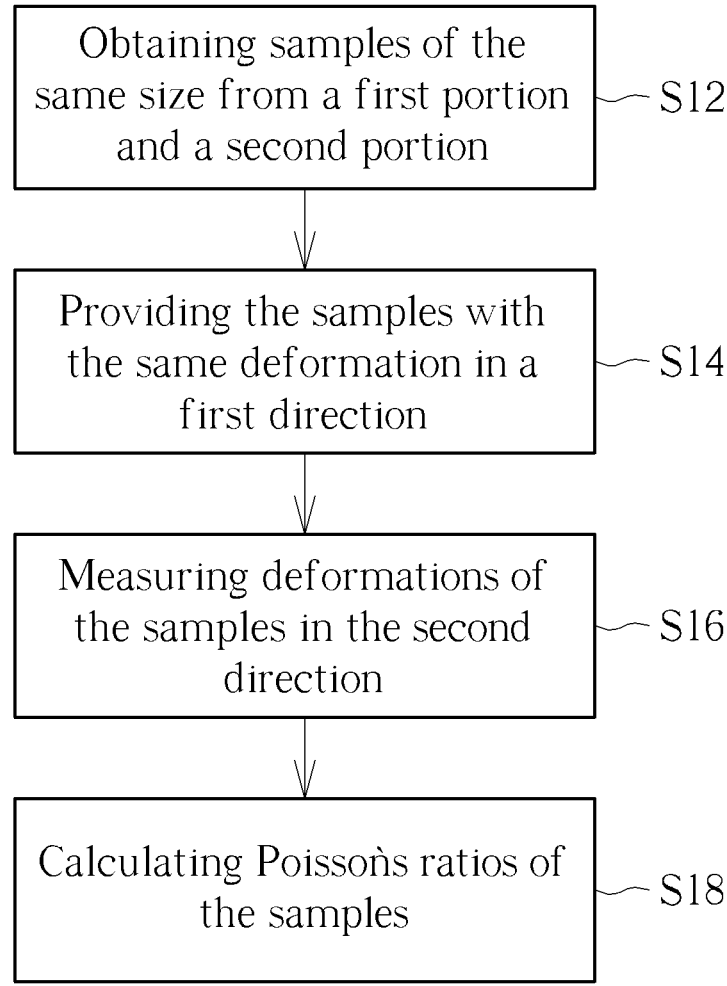
FIG. 4 schematically illustrates a flowchart of a method for measuring Poisson's ratios of a first portion and a second portion of a flexible substrate structure according to some embodiments of the present disclosure.

Refer to FIG. 4 together with FIG. 2. FIG. 4 schematically illustrates a flowchart of a method for measuring the Poisson's ratios of the first portion and the second portion of the flexible substrate structure according to some embodiments of the present disclosure. As shown in FIG. 4, the method for measuring the Poisson's ratios of the first portion and the second portion (such as the first portion P1 and one of the second portions P2 shown in FIG. 2) may include a step S12 to a step S18. In this embodiment, the step S12 to the step S18 may be performed in sequence. In some embodiments, other steps may be performed before or after the step S12 to the step S18, between any two of the step S12 to the step S18, or at the same time as any one of the step S12 to the step S18. The method for measuring the Poisson's ratios of the first portion P1 and the second portion P2 will be further described in detail below with reference to FIG. 2 and FIG. 4.

As shown in FIG. 2 and FIG. 4, in the step S12, a sample S1 and a sample S2 of the same size may be obtained from the first portion P1 and one of the second portions P2 of the flexible substrate structure 14 respectively. The sample S1 and the sample S2 may be obtained by, for example, cutting, clipping or other suitable methods. In this embodiment, the sample S1 and the sample S2 may, for example, have the same length and width when viewed along the normal direction ND, so as to facilitate comparison of deformations of the sample S1 and the sample S2. It should be noted that the method for measuring the Poisson's ratios of the first portion P1 and one of the second portions P2 is performed after the electronic device 1 is detached from the object 10 and the covering layer 12 is removed. Because in the processes of detaching the electronic device 1 from the object 10 and removing the covering layer 12, a part of layers may remain on the object 10 or the covering layer 12, the first portion P1 of the flexible substrate structure 14 and the second portion P2 may not include all the layers and/or elements of the electronic device 1. In other words, the sample S1 and the sample S2 may not include all the layers and/or elements of the electronic device 1. Since the layers and elements (such as the insulating layers, the circuit layer and/or the electronic elements) on the first substrate 161 and the second substrate 162 have little influence on the difference in Poisson's ratio between the first substrate 161 and the second substrate 162, the sample S1 mainly includes the first substrate (the first substrate 161 shown in FIG. 3), while the sample S2 mainly includes the second substrate (the second substrate 162 shown in FIG. 3). In some embodiments, the sample S1 may include a part of the insulating layers, a part of the circuit layer 20 and/or a part of the electronic elements 22 on the first substrate 161, and the sample S2 may include a part of the insulating layers, a part of the circuit layer 20 and/or a part of the electronic elements 22. In some embodiments, the sample S1 and the sample S2 may optionally include an adhesive layer 48 and/or a flexible layer 46.

In some embodiments, since the measurement of the Poisson's ratios is performed after the electronic device 1 is detached from the object and after the covering layer 12 is removed, the sample S1 and the sample S2 are respectively obtained from the first portion P1 and the second portion P2 of the flexible substrate structure 14. Also, since the layers and elements (such as the insulating layers, the circuit layer and/or the electronic elements) on the first substrate 161 and the second substrate 162 have little influence on the difference between the Poisson's ratios of the first substrate 161 and the second substrate 162, the first portion P1 and the second portion P2 may not be limited to include all the layers on the first substrate 161 and the second substrate 162, and the first portion P1 may mainly include the first substrate (the first substrate 161 shown in FIG. 3), and the second portion P2 may mainly include the second substrate (such as the second substrate 162 shown in FIG. 3). Alternatively, the first portion P1 may optionally include at least one layer on the first substrate 161 counting from the insulating layer 18, and the second portion P2 may optionally include at least one layer on the second substrate 162 counting from the insulating layer 18, but the present disclosure is not limited thereto.

As shown in FIG. 4, in the step S14, forces may be respectively applied to the sample S1 and the sample S2 (e.g., applied along the same first direction) to provide the sample S1 and the sample S2 with the same deformation in the first direction. In this embodiment, the sample S1 (or the sample S2) may be subjected to a tensile force along a long axis of the sample S1 (or the sample S2), such that the sample S1 (or the sample S2) may have tensile deformation along its long axis, but not limited thereto. For example, the deformation of the sample S1 (or the sample S2) in the first direction may be an increased change in length of the sample S1 (or the sample S2) after being subjected to the force in the first direction, and the increased changes in length of the sample S1 and the sample S2 may be the same as each other. In some embodiments, the method of applying force to the sample S1 and the sample S2 may be performed, for example, by a tensile testing machine, hands or other suitable methods, and the present disclosure is not limited thereto.

Subsequently, in the step S16, deformations of the sample S1 and the sample S2 in the second direction may be measured while maintaining providing the sample S1 and the sample S2 with the same deformation in the first direction. The first direction and the second direction may be located on the same plane and be perpendicular to each other. For example, the first direction may be a direction of the long axis of the sample S1 (or the sample S2), and the second direction may be another direction of a short axis of the sample S1 (or the sample S2). The deformation of the sample S1 (or the sample S2) in the second direction may be an observed change in width of the sample S1 (or the sample S2) in the second direction. It should be noted that when the width of the sample S1 (or the sample S2) in the second direction after being subjected to the force is less than the width of the sample S1 (or the sample S2) in the second direction before the force is applied, the deformation may be positive. On the contrary, when the width of the sample S1 (or the sample S2) in the second direction after being subjected to the force is greater than the width of the sample S1 (or the sample S2) in the second direction before the force is applied, the deformation may be negative. In the step S14 and the step S16, the deformation of the sample S2 (or the sample S1) in the first direction is also provided, and the deformation of the sample S2 (or the sample S1) in the second direction is measured. Through the step S14 and the step S16, the deformations of the sample S1 and the sample S2 in the first direction may be provided, and the deformations of the sample S1 and the sample S2 in the second direction may be measured. In some embodiments, the steps of providing the deformations of the sample S1 and the sample S2 in the first direction may be performed separately or simultaneously. In some embodiments, the step of measuring the deformation of the sample S1 in the second direction and the step of measuring the deformation of the sample S2 in the second direction may be performed separately or simultaneously. In some embodiments, since the sizes of the first portion P1 and the second portion P2 affect the sizes of the sample S1 and the sample S2, the method for measuring the deformations may be adjusted according to the sizes of the sample S1 and the sample S2. For example, if the sizes of the sample S1 and the sample S2 meet the minimum requirement of the tensile testing machine, the tensile testing machine or other suitable instruments may be selected for measurement.

In step S18, through the measured deformations in the second direction and the provided deformations in the first direction, the Poisson's ratios of the sample S1 and the sample S2 may be calculated through the formula (1), and then, the difference between the Poisson's ratios of the first portion P1 and the second portion P2 may be compared. It should be noted that, when one of the deformations is positive, the corresponding Poisson's ratio may be greater than zero, and when one of the deformations is negative, the corresponding Poisson's ratio may be less than zero.

Figures 5, 6, 7:
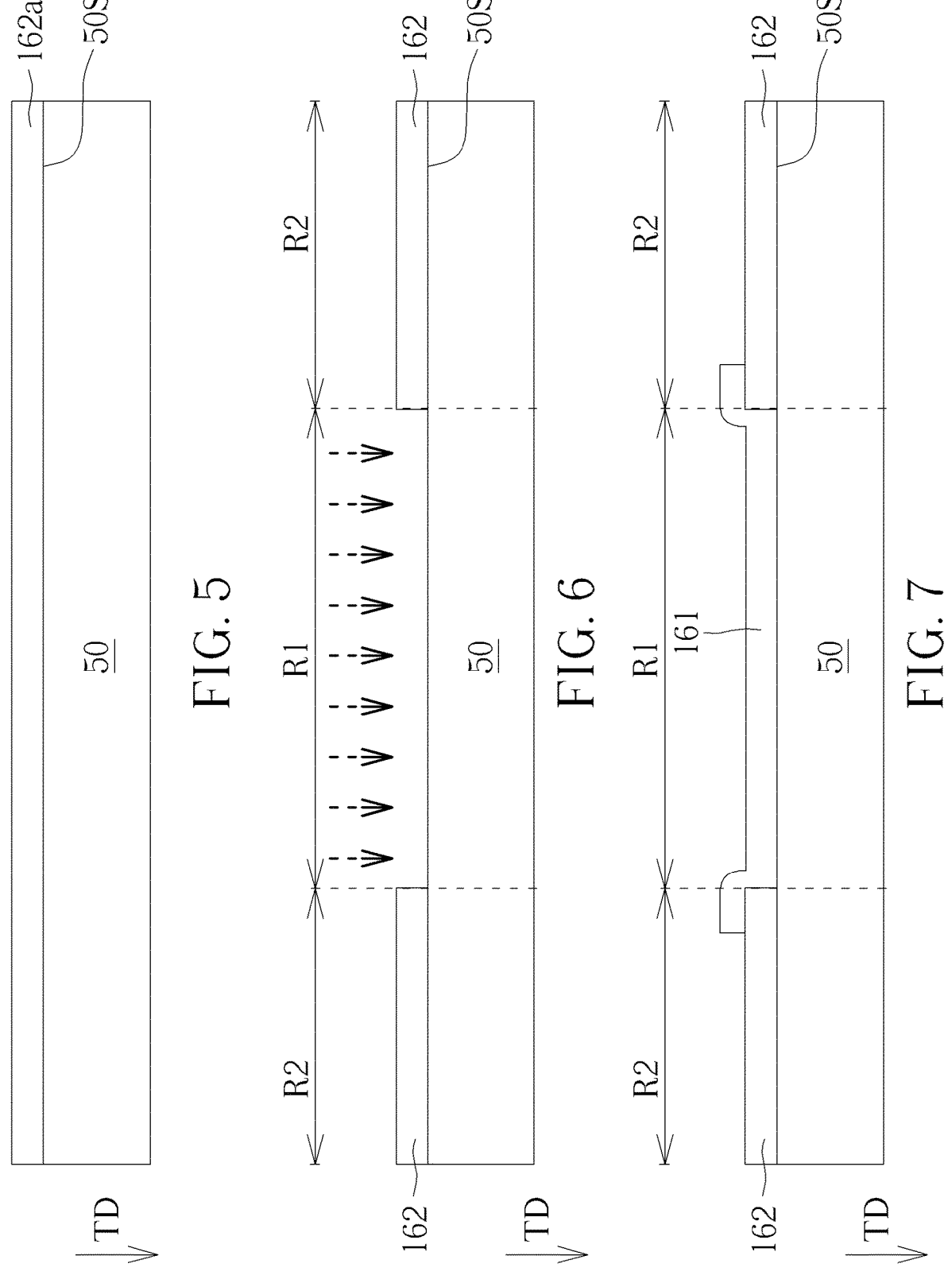
FIG. 5 to FIG. 9 are schematic diagrams illustrating structures in different steps of a manufacturing method of the flexible substrate structure, respectively.

Refer to FIG. 5 to FIG. 9. FIG. 3 and FIG. 5 to FIG. 9 schematically illustrate a manufacturing method of the flexible substrate structure of the electronic device according to some embodiments of the present disclosure, wherein FIG. 5 to FIG. 9 are schematic diagrams illustrating structures in different steps of the manufacturing method of the flexible substrate structure, respectively. As shown in FIG. 5, first, a carrier 50 is provided, and the auxetic material layer 162a is formed on an upper surface 50S of the carrier 50. When the auxetic material layer 162a includes graphene, the carrier 50 may include copper to improve catalysis for the graphene, such that the graphene may be formed on the carrier 50 through for example a chemical vapor deposition process. The carrier 50 may, for example, include a copper foil substrate or other suitable substrate materials. In some embodiments, when other materials are used for the auxetic material layer 162a, other materials may be selected for the carrier 50.

As shown in FIG. 6, a patterning process is performed on the auxetic material layer 162a to remove a part of the auxetic material layer 162a, and the remaining part of the auxetic material layer 162a may form the second substrate 162. The distribution region of the second substrate 162 may be designed to be corresponding to the second region of the covering layer. In this embodiment, when viewed along the top view direction TD of the second substrate 162, the distribution region of the second substrate 162 may be the same as that of the second region R2, so a region without the second substrate 162 may be the first region R1, but not limited to. The patterning process may, for example, include lithography and etching processes or other suitable processes. The top view direction TD of the second substrate 162 may, for example, be the same as the normal direction ND of the flexible substrate structure 14 shown in FIG. 2 and FIG. 3.

As shown in FIG. 7, after the second substrate 162 is formed, the first substrate 161 may be formed on the carrier 50 and the second substrate 162. The method of forming the first substrate 161 may, for example, include forming a flexible material on the carrier 50 and the second substrate 162 and then performing a patterning process to remove a part of the flexible material, and the remaining part of the flexible material may form the first substrate 161 corresponding to the first region R1. The method for forming the flexible material may, for example, include a coating process or other suitable processes. In the embodiment of FIG. 7, a part of the first substrate on the second substrate may not be removed, such that the first substrate 161 and the second substrate 162 may be partially overlapped with each other in the top view direction TD of the second substrate 162, but not limited thereto.

Figure 8:
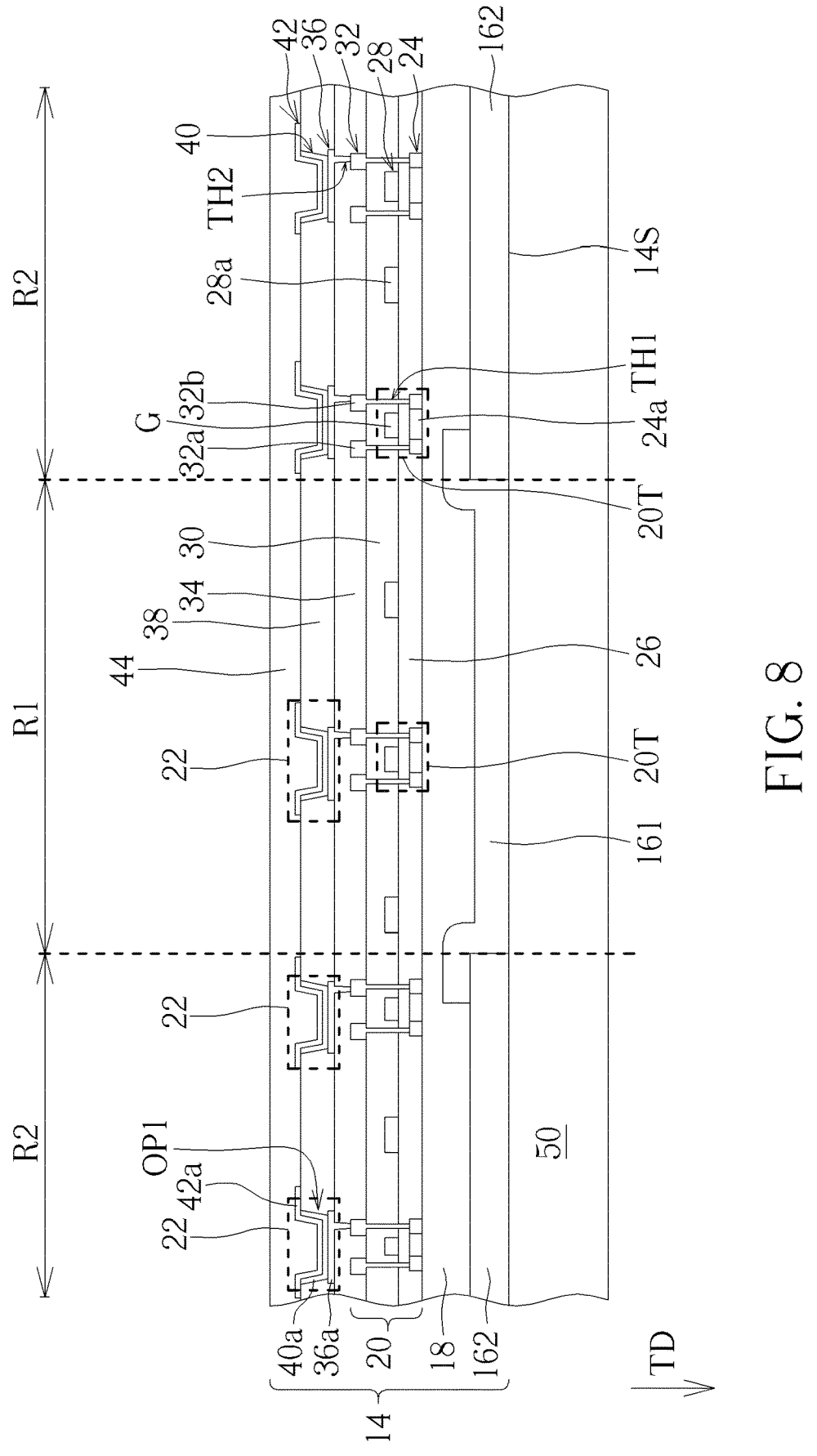

As shown in FIG. 8, after the first substrate 161 and the second substrate 162 are formed, the insulating layer 18, the circuit layer 20 and the electronic elements 22 may be formed on the first substrate 161 and the second substrate 162. The processes of forming the insulating layer 18, the circuit layer 20 and the electronic elements 22 may, for example, include a thin film process or other suitable methods. The thin film process may include, for example, thin film deposition processes, lithography and etching processes, and/or other suitable processes, but not limited thereto. Next, an insulating layer 44 is formed on the electronic elements 22 to form the flexible substrate structure 14. In this case, surfaces of the first substrate 161 and the second substrate 162 in contact with the upper surface 50S of the carrier 50 may serve as the lower surface 14S of the flexible substrate structure 14. Since the methods for forming the insulating layer 18, the circuit layer 20, the electronic elements 22 and the insulating layer 44 are known to those skilled in the art, they will not be detailed herein. Moreover, structures of the circuit layer 20 and the electronic elements 22 may be adjusted according to different requirements, and the methods for forming the circuit layer 20 and the electronic elements 22 may be adjusted accordingly.

Figure 9:
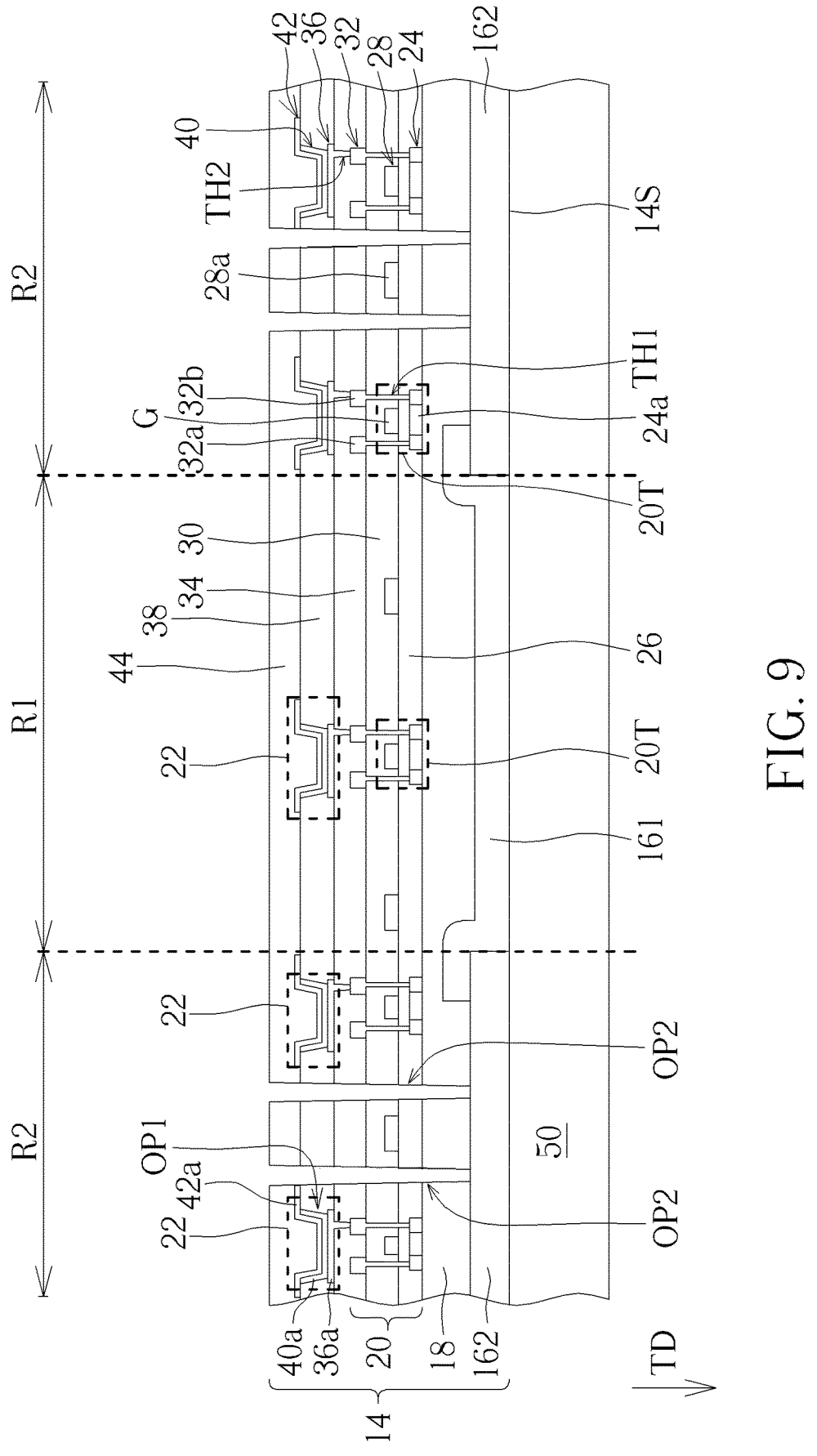

As shown in FIG. 9, after the insulating layer 44 is formed, at least one opening OP2 penetrating the insulating layer 18, the circuit layer 20, the insulating layer 34, the insulating layer 38, and the insulating layer 44 may be optionally formed in the second region R2 to expose a part of the second substrate 162. As shown in FIG. 3, after the opening OP2 are formed, the covering layer 12 may be disposed on the insulating layer 44. In one embodiment, the covering layer 12 may fill a part of the opening OP2. Next, the carrier 50 may be removed to form the electronic device 1. In some embodiments, the flexible layer 46 may optionally be attached to the lower surface 14S of the flexible substrate structure 14 through the adhesive layer 48 to form the electronic device 1 of some embodiments. In some embodiments, after the insulating layer 44 is formed, the opening OP2 may not be formed, and the step of removing the carrier 50 may be directly performed, but not limited thereto.

It is noted that, since the flexible layer 46 is disposed on the flexible substrate structure 14 after the process of forming the circuit layer 20 and the electronic elements 22, a material that has a tolerable temperature lower than a process temperature for forming the circuit layer 20 and the electronic elements 22 may be used for the flexible layer 46. Compared with the flexible layer 46, since the first substrate 161 and the second substrate 162 need to undergo the processes of forming the circuit layer 20 and the electronic elements 22, the first substrate 161 and the second substrate 162 may include a material that has a tolerable temperature higher than the process temperature for forming the circuit layer 20 and the electronic elements 22.

Figure 10:
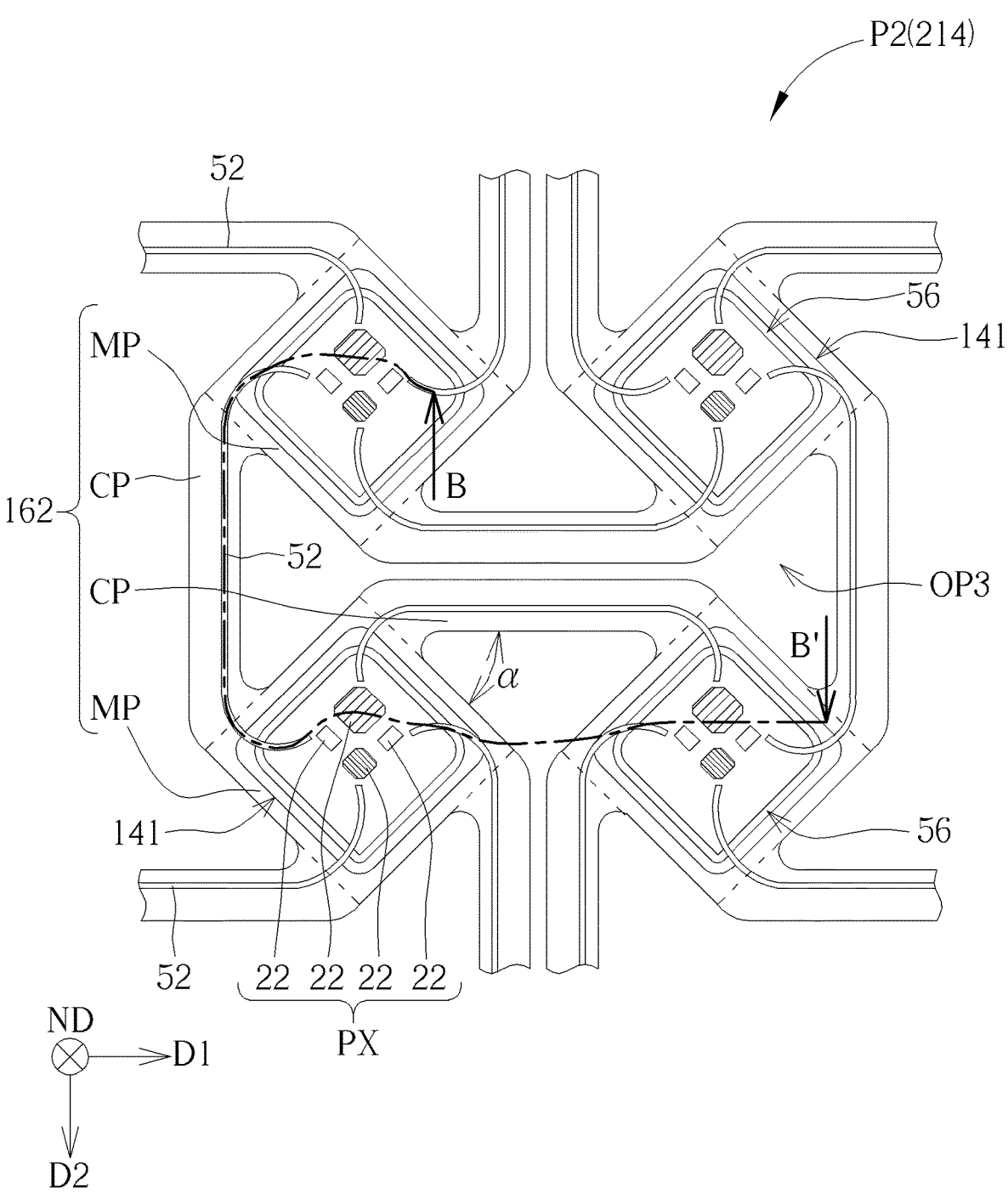
FIG. 10 schematically illustrates a top view of a second portion of a flexible substrate structure in an electronic device according to a second embodiment of the present disclosure.
Figure 11:
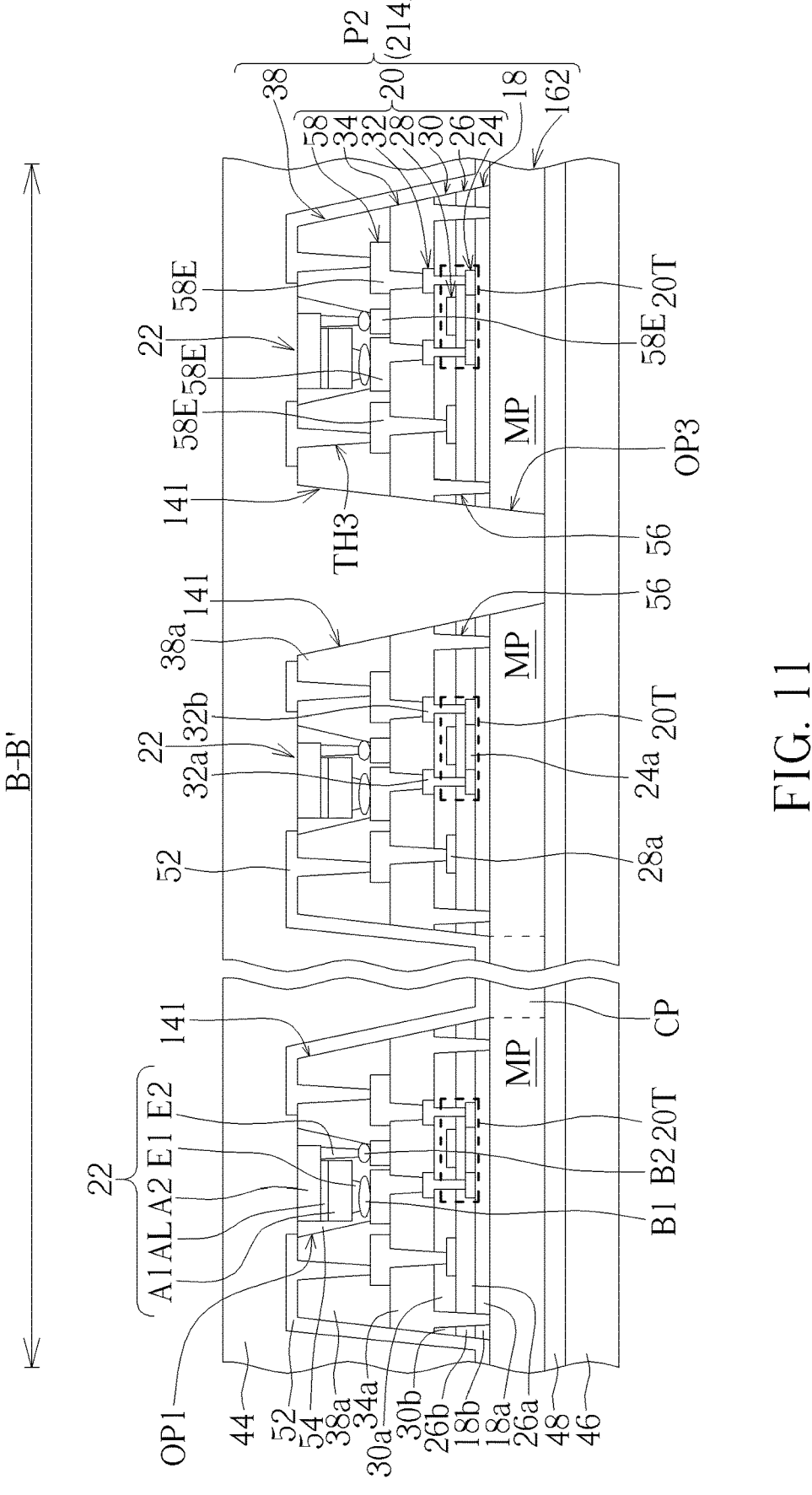
FIG. 11 schematically illustrates a cross-sectional view taken along a section line B-B' of FIG. 10.

Refer to FIG. 10 and FIG. 11. FIG. 10 schematically illustrates a top view of a second portion of a flexible substrate structure in an electronic device according to a second embodiment of the present disclosure, and FIG. 11 schematically illustrates a cross-sectional view taken along a section line B-B' of FIG. 10. In order to clearly show the structure of the second portion P2 of the flexible substrate structure 214, FIG. 10 shows a partially enlarged view of the second portion P2, and the first portion P1 is omitted in FIG. 10 and FIG. 11, but not limited thereto. As shown in FIG. 10, the flexible substrate structure 214 of this embodiment differs from the flexible substrate structure 14 of the above embodiment in that the second substrate 162 may be patterned to achieve that the Poisson's ratio of the second portion P2 of this embodiment is different from the Poisson's ratio of the first portion (e.g., the first portion P1 as shown in FIG. 3). For example, in the case where the absolute value of the Gaussian curvature of the first region (e.g., the first region R1 as shown in FIG. 3) is less than the absolute value of the Gaussian curvature of the second region (e.g., the second region R2 as shown in FIG. 3), the Poisson's ratio of the second portion P2 may be less than the Poisson's ratio of the first portion. In one embodiment, the case that the Poisson's ratio of the second portion P2 is less than the Poisson's ratio of the first portion may be achieved by designing the Poisson's ratio of the second substrate 162 to be less than zero and less than the Poisson's ratio of the first substrate (e.g., the first substrate 161 as shown in FIG. 3), but not limited thereto. In the embodiment of FIG. 10 and FIG. 11, a structure of the first portion of the flexible substrate structure 214 may be the same as or similar to the structure of the first portion P1 shown in FIG. 3, that is, the first substrate is not patterned, so it is not shown in FIG. 10 and FIG. 11, and it is not detailed redundantly herein.

In the embodiment of FIG. 10, the first substrate and the second substrate 162 may include the same flexible material. For example, the first substrate and the second substrate 162 may be formed of the same material, and the second substrate 162 has a patterned structure, but not limited thereto. In some embodiments, the first substrate and the second substrate 162 may be formed of different materials. In this case, the second substrate 162 may still have the patterned structure, but not limited thereto.

Specifically, as shown in FIG. 10 and FIG. 11, the second substrate 162 may include a plurality of main portions MP and a plurality of connecting portions CP, wherein at least one of the connecting portions CP may connect at least two of the main portions MP adjacent to each other. In this embodiment, the main portion MP may have a rectangular structure, and the connecting portion CP may have a strip structure, so that a width of the main portion MP may be greater than a width of the connecting portion CP at a junction of the main portion MP and the connecting portion CP, but not limited thereto. For example, a region of each main portion MP may be defined by four dotted lines respectively overlapping the four sides of the main portion MP or may be defined by a smallest imaginary rectangular frame surrounding each main portion MP. Four corners of each main portion MP may be respectively connected to four connecting portions CP, and the four main portions MP and the four connecting portions CP may surround an opening OP3. A size of the opening OP3 may be changed as the flexible substrate structure 214 is stretched, such that the second substrate 162 may have the Poisson's ratio less than zero. Further, when the flexible substrate structure 214 is not stretched, a distance between two adjacent main portions MP arranged along the first direction D1 (or the second direction D2) may be less than a length of one of the connecting portions extending along the first direction D1 (or the second direction D2). When the flexible substrate structure 214 is stretched along the first direction D1 (or the second direction D2), the main portion MP may be moved, and for example, an angle (e.g., an angle α) between one of the connecting portions CP and one of the main portions MP connected thereto may be changed. In this way, not only a distance between adjacent two of the main portions MP arranged in the first direction D1 (or the second direction D2) may be increased, but also the distance between the adjacent two of the main portions MP may be increased to be close to or equal to the length of one of the connecting portions CP. Accordingly, the second substrate 162 or the second portion P2 of the flexible substrate structure 214 having the Poisson's ratio less than zero may be achieved.

It should be noted that a shape of the opening OP3 of the second substrate 162 in the present disclosure is mainly to enables the main portion MP adjacent to the opening OP3 to move during being stretched, such that the second substrate 162 has the Poisson's ratio less than zero. For example, the shape of the opening OP3 may be the shape shown in FIG. 10, an X shape, a polygon or other suitable shapes, but not limited thereto.

In this embodiment, the second portion P2 of the flexible substrate structure 214 may include a plurality of block structures 141 which may be respectively disposed on the main portions MP. In other words, layers of the second portion P2 on the second substrate 162 may be patterned to form the block structures 141. Referring to FIG. 10 and FIG. 11, each block structure 141 may include, for example, the insulating layer 18, the circuit layer 20, the insulating layer 38 and the electronic element 22. The insulating layer 18 may be disposed on the main portions MP of the second substrate 162, the circuit layer 20 may be disposed on the insulating layer 18, the insulating layer 38 may be disposed on the insulating layer 18, and the electronic elements 22 may be respectively disposed on the corresponding openings OP1 of the insulating layer 38.

In this embodiment, the number of electronic elements 22 in each block structure 141 may be at least one, but not limited thereto. As shown in FIG. 10, in this embodiment, one of the block structures 141 may be one pixel PX and may include a plurality of electronic elements 22, but not limited thereto. In some embodiments that are not shown in the drawings, one of the block structures may include a plurality of pixels, and each pixel may include at least one of the electronic elements 22, but not limited thereto.

As shown in FIG. 10 and FIG. 11, in each block structure 141, the circuit layer 20 may, for example, include wires, insulating layers, active elements and/or passive elements. As an example, the circuit layer 20 may include a plurality of transistors 20T, and at least one of the transistors 20T may be coupled to at least one of the electronic elements 22 and may serve as the driving element and/or the switching element of the corresponding electronic element 22, but not limited thereto. Since the transistor 20T may be similar to or the same as the transistor 20T shown in FIG. 3, it is not detailed redundantly herein.

It should be noted that the insulating layer 38, the insulating layer 34, the insulating layer 30, the insulating layer 26 and the insulating layer 18 may include any suitable organic material and/or inorganic material mentioned above. In some embodiments, at least the insulating layer 18 and the insulating layer 26 in each block structure 141 may be patterned to form a trench 56. The trench 56 may divide the insulating layer 18 and the insulating layer 26 into the insulating block 18b and the insulating block 26b adjacent to an outer edge of the block structure 141 and the insulating block 18a and the insulating block 26a away from the outer edge of the block structure 141. In other words, the trench 56 may be disposed between a stacked structure of the insulating block 18a and the insulating block 26a and a stacked structure of the insulating block 18b and the insulating block 26b. An insulating layer (e.g., the insulating layer 30) on and closest to the insulating layer 26 may be disposed in at least a part of the trench 56. Since the flexible substrate structure 214 may have cracks in the block structure 141 and/or peeling between different insulating layers (e.g., the insulating layer 18 and the insulating layer 26) while being stretched or bent, an insulating layer filled in the trench 56 may reduce the cracks or peeling of the insulating layers from extending to the insulating block 18a and the insulating block 26a, thereby mitigating entry of moisture and/or oxygen into the circuit layer 20 or the electronic elements 22. Accordingly, the reliability of the electronic device may be improved. The trench 56 may be, for example, a closed ring shape, but not limited thereto. In this embodiment, the trench 56 may penetrate through the insulating layer 18, the insulating layer 26 and the insulating layer 30, so that the insulating layer 30 may also be patterned into an insulating block 30a and an insulating block 30b. In this case, the insulating layer 34 on the insulating layer 30 may be disposed in at least a part of the trench 56. The layers penetrated by the trench 56 in the present disclosure are not limited to the insulating layer 18, the insulating layer 26 and the insulating layer 30. In some embodiments, the trench 56 may penetrate through the insulating layer 34, and the insulating layer 38 may fill at least a part of the trench 56, but not limited thereto. For example, the insulating layer (e.g., the insulating layer 30, the insulating layer 34, or the insulating layer 38) disposed in the trench 56 may include any suitable organic materials mentioned above, such as polyfluoroalkoxy (PFA), but not limited thereto.

In the embodiment of FIG. 11, the circuit layer 20 of each block structure 141 may further include a conductive layer 58 for coupling the electronic elements 22 or other elements to transistors or other elements in the circuit layer 20. For example, the conductive layer 58 may include a plurality of electrodes 58E. One of the electrodes 58E may be coupled to one of the electrodes 28a of the conductive layer 28 through a through hole of the insulating layer 34. One of the openings OP1 of the insulating layer 38 may expose two of the electrodes 58E, so that an electrode E1 and an electrode E2 of one of the electronic elements 22 may be respectively coupled to the two electrodes 58E exposed by the corresponding opening OP1. One of the two electrodes 58E exposed by the corresponding opening OP1 may be coupled to one of the electrodes 32a of the conductive layer 32 through the through hole of the insulating layer 34, so as to be coupled to one of the source region and the drain region of the semiconductor 24a of one of the transistors 20T. Another one of the electrodes 58E may be coupled to another one of the source region and the drain region of the semiconductor 24a of the transistor 20T through another through hole of the insulating layer 34 and one of the electrodes 32b of the conductive layer 32. The circuit layout of the circuit layer 20 and methods of coupling the circuit layer 20 to the electronic elements 22 in the present disclosure are not limited to those shown in FIG. 11 and may be adjusted according to requirements.

As shown in FIG. 10 and FIG. 11, the flexible substrate structure 214 may further include a plurality of wires 52 disposed on the block structures 141, and one of the wires 52 is used to couple two adjacent block structures 141 to each other. Specifically, one end of one of the wires 52 may be disposed on one of the block structures 141 and extend along a sidewall of the block structure 141, a surface of the connecting portion CP and a sidewall of another block structure 141, such that the other end of the wire 52 may be disposed on the another block structure 141. In some embodiments, the number of the wires 52 for connecting two adjacent block structures 141 is not limited to one as shown in FIG. 10 and may be plural.

As shown in FIG. 11, the insulating layer 38 of one of the block structures 141 may have at least one through hole TH3, such that one of the wires 52 may be coupled to the conductive layer 58 through the through hole TH3. For example, one end of the wire 52 may extend into the through hole TH3 to be coupled to one of the electrodes 58E, thereby being coupled to one of the transistors 20T through the electrode 58E and one of the electrodes 32b, be coupled to the electrode 28a through another one of the electrodes 58E, or be coupled to other electrodes or signal lines, but not limited thereto.

In the embodiment of FIG. 11, the electronic element 22 is an inorganic light emitting diode as an example, but it is not limited thereto. Each electronic element 22 may, for example, include a semiconductor A1, a semiconductor A2, an active layer AL between the semiconductor A1 and the semiconductor A2, the electrode E1 connected to the semiconductor A1, and the electrode E2 connected to the semiconductor A2, wherein the electrode E1 and the electrode E2 may be coupled to two of the electrodes 58E of the conductive layer 58 through a bonding material B1 and another bonding material B2 respectively. Through the conductive layer 58, the electronic elements 22 may be coupled to the transistors 20T or other electronic elements. The bonding material B1 and the bonding material B2 may include, for example, anisotropic conductive film (ACF), tin (Sn), an alloy of gold and tin (Au—Sn alloy), silver glue, other suitable materials, or any combination of the above materials, but not limited thereto. In some embodiments, each block structure 141 may optionally include a package layer 54 disposed in one of the openings OP1 of the insulating layer 38 and surrounding one of the electronic elements 22 for protecting the electronic element 22 or increasing bonding between the electronic element 22 and the conductive layer 58. In some embodiments, the package layer 54 may cover the corresponding electronic element 22. In some embodiments, the electronic element 22 may adopt the organic light emitting diode shown in FIG. 3 or other suitable electronic elements. In some embodiments, the electronic element 22 in FIG. 11 may be applied to any other embodiments herein. It should be noted that the block structure 141 shown in FIG. 11 is as an example and is not limited thereto.

As shown in FIG. 11, the flexible substrate structure 214 may further include an insulating layer 44, wherein the insulating layer 44 may be disposed on the electronic elements 22 and cover the electronic elements 22 to improve the yield of the flexible substrate structure 214, but not limited thereto. In this embodiment, the insulating layer 44 may be disposed between adjacent two of the block structures 141, and the insulating layer 44 may be disposed in the opening OP3.

Figure 12:
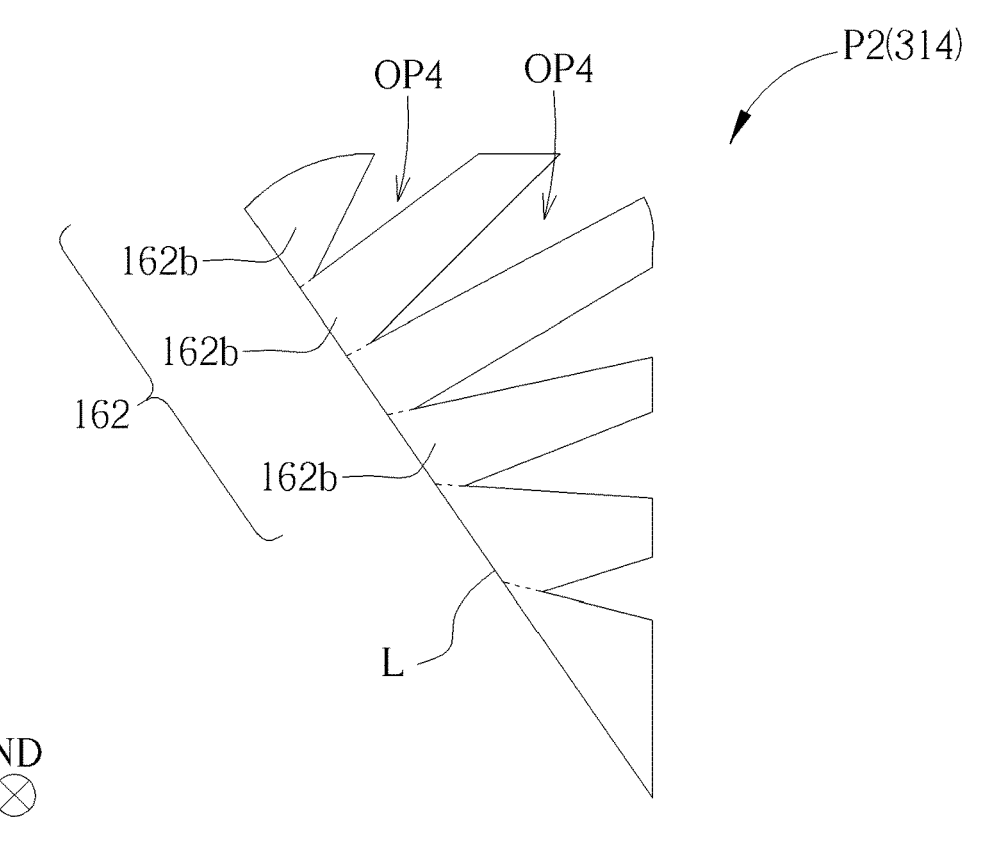
FIG. 12 schematically illustrates a top view of a second portion of a flexible substrate structure in an electronic device according to a third embodiment of the present disclosure.

Refer to FIG. 12, which schematically illustrates a top view of a second portion of a flexible substrate structure in an electronic device according to a third embodiment of the present disclosure. As shown in FIG. 12, in the flexible substrate structure 314 provided in this embodiment, the second substrate 162 of the second portion P2 may include a plurality of openings OP4 and a plurality of segments 162b, wherein each opening OP4 may be respectively disposed between two adjacent segments 162b. The segment 162b may be, for example, a strip shape, a rectangle shape, an arc shape, or other suitable shapes. In this embodiment, one end of one of the two adjacent segments 162b may be connected to one end of the other one of the two adjacent segments 162b and be connected to the first portion (e.g., the first portion P1 shown in FIG. 2). In addition, a side of one of the segments 162b connected to the first portion may be connected to form a straight line L, for example. A width of one of the openings OP4 may be gradually increased along a direction perpendicular to the straight line L as a distance between the opening OP4 and the straight line L is increased. For example, the segments 162b may form a fringe-like shape. The opening OP4 may enable the second portion P2 to be more easily disposed on the curved surface of the object (e.g., the corner surface 10S2). One of the segments 162b may be, for example, a region between two adjacent openings OP4, or a boundary between two adjacent segments 162b may be distinguished, for example, by a virtual line extended from a side of one of the two adjacent segments 162b. In some embodiments, the segments 162b may use the second substrate 162 shown in FIG. 3 having a substrate material different from the first substrate or the second substrate 162 shown in FIG. 10 having the patterned structure, but not limited thereto.

Figure 13:
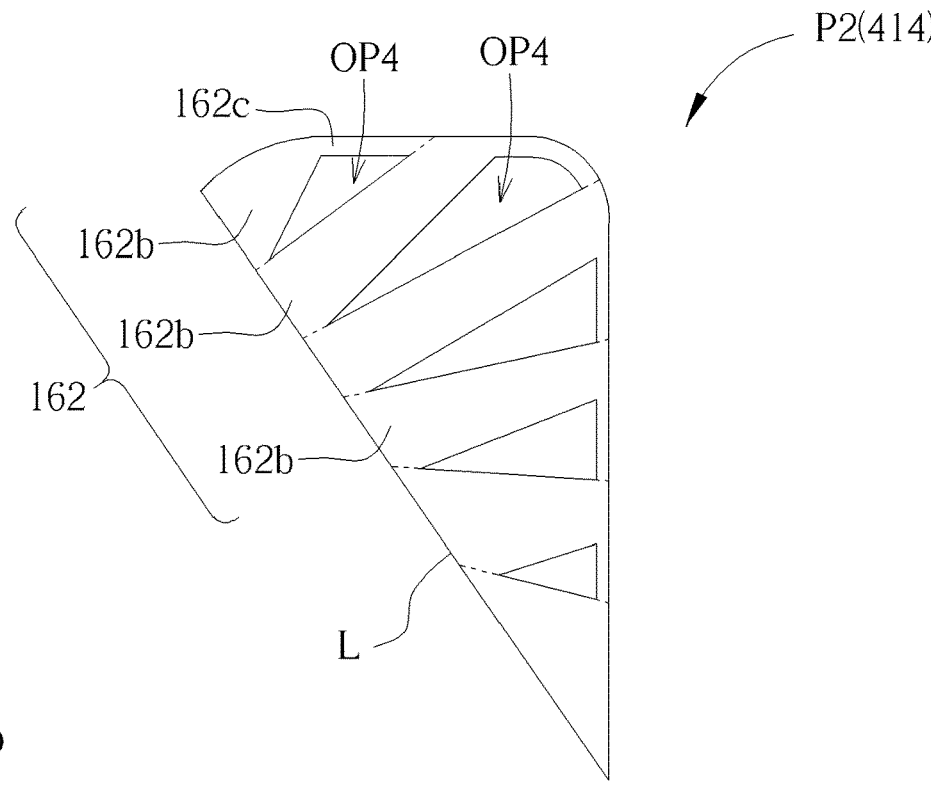
FIG. 13 schematically illustrates a top view of a second portion of a flexible substrate structure in an electronic device according to a fourth embodiment of the present disclosure.

Refer to FIG. 13, which schematically illustrates a top view of a second portion of a flexible substrate structure in an electronic device according to a fourth embodiment of the present disclosure. The second portion P2 of the flexible substrate structure 414 provided in this embodiment differs from the second portion P2 shown in FIG. 12 in that two ends of one of two adjacent segments 162b may be respectively connected to two ends of another one of the two adjacent segments 162b to form an opening OP4. For example, in two adjacent segments 162b, one of them may include a connecting portion 162c for being connected to an end of another one of them. Since the ends of any two adjacent segments 162b opposite to the first portion may be connected to each other, it may be helpful to stretch all the segments 162b simultaneously when stretching the second portion, thereby improving the assembly quality. In some embodiments, adjacent two of the segments 162b may be connected to each other through other portions of the second substrate 162.

Figure 14:
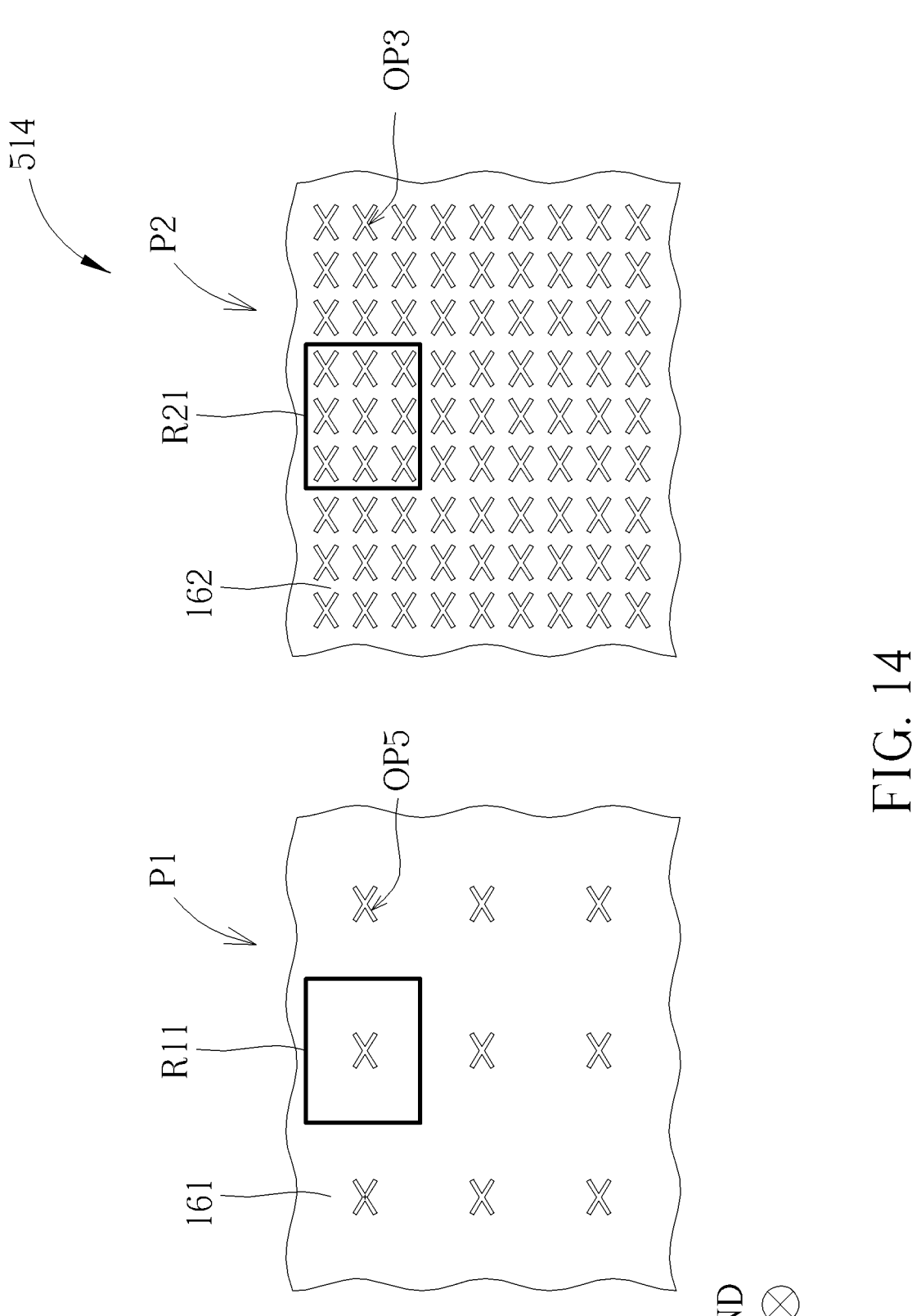
FIG. 14 schematically illustrates a top view of a flexible substrate structure in an electronic device according to a fifth embodiment of the present disclosure.

Refer to FIG. 14, which schematically illustrates a top view of a flexible substrate structure in an electronic device according to a fifth embodiment of the present disclosure. To clearly illustrate the difference between the first portion P1 and the second portion P2, FIG. 14 shows parts of the first portion P1 and the second portion P2, but not limited thereto. As shown in FIG. 14, the flexible substrate structure 514 provided in this embodiment differs from the flexible substrate structure 214 shown in FIG. 10 in that the first portion P1 of this embodiment may have a plurality of openings OP5, so that the Poisson's ratio of the first portion P1 may be less than zero. In this case, the second portion P2 may also have a plurality of openings OP3, in which the Poisson's ratio of the second portion P2 may be less than zero, and an absolute value of the Poisson's ratio of the second portion P2 may be greater than an absolute value of the Poisson's ratio of the first portion P1. In this embodiment, the absolute value of the Gaussian curvature of the first region (e.g., the first region R1 shown in FIG. 3) may be less than the absolute value of the Gaussian curvature of the second region (e.g., the second region R2 shown in FIG. 3), so that the difference between the absolute values of the above Poisson's ratios may enable an increase in width of the second portion P2 in the second direction to be greater than that of the first portion P1 when being stretched in the first direction. Accordingly, it helps to dispose the second portion P2 on a surface with a higher Gaussian curvature. With this design, in an application of display, an aspect ratio of the second portion P2 may be closer to an aspect ratio of the first portion P1. For example, the openings OP5 are less than the openings OP3 in density (or distribution density). The density of the openings OP5 and the density of the openings OP3 may be obtained by, for example, selecting a region R11 and a region R21 of the same size in the first portion P1 and the second portion P2 respectively and calculating the number of the openings OP5 in the region R11 and the number of the openings OP3 in the region R21. The sizes of the region R11 and the region R21 may be adjusted according to requirements. For example, when the size of the region R11 is enough to include at least one opening OP5, the number of the openings OP3 included in the region R21 with the same size as the region R11 may be greater than the number of the openings OP5 included in the region R11. In some embodiments, since a shape of the opening OP3 and a shape of the opening OP5 are mainly to enable the main portions adjacent to the opening OP3 and the opening OP5 to move during being stretched to achieve the effect of the second substrate 162 and the first substrate 161 having the Poisson's ratio less than zero, the shape of the opening OP3 and the shape of the opening OP5 may include, for example, an X shape, a polygon, the shape of the opening OP3 in FIG. 10, or other suitable shapes.

Figure 15:
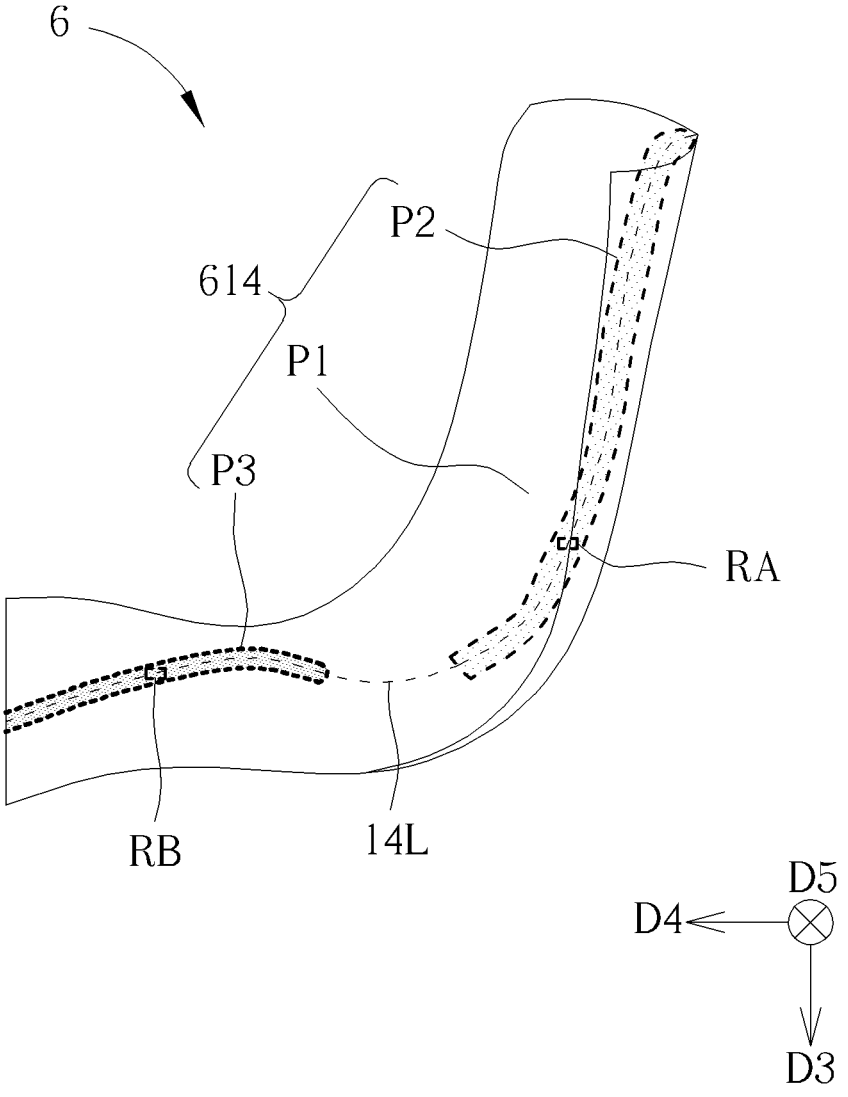
FIG. 15 schematically illustrates a perspective view of an electronic device according to a sixth embodiment of the present disclosure.
Figure 16:
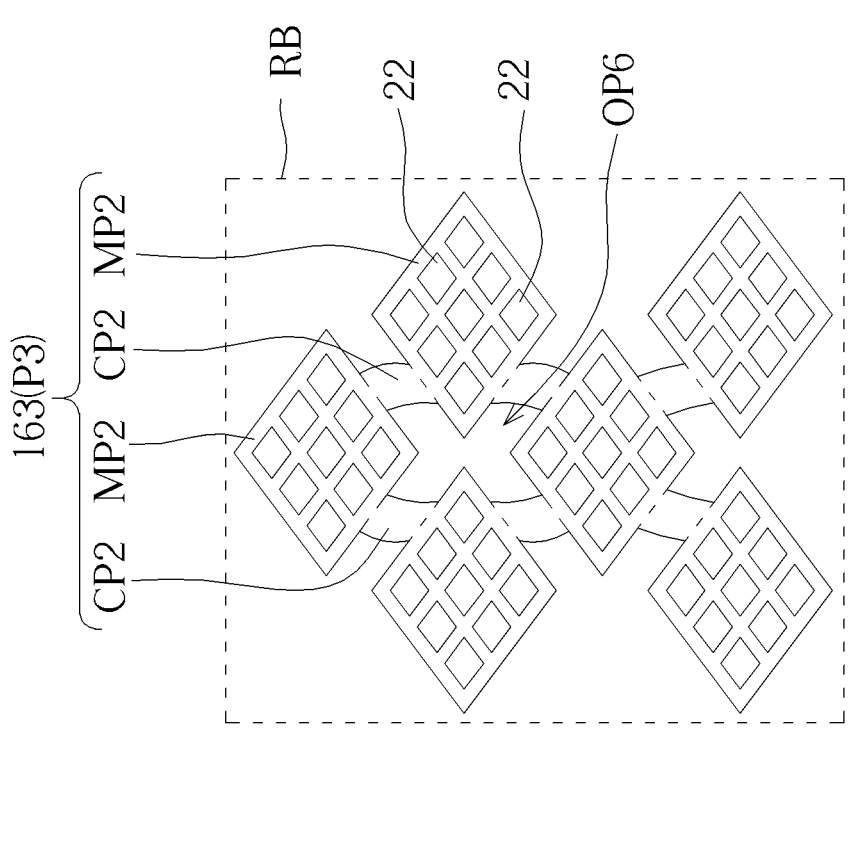
FIG. 16 schematically illustrates enlarged views of parts of a flexible substrate structure corresponding to a region RA and a region RB of the electronic device shown in FIG. 15.
Figure 16:
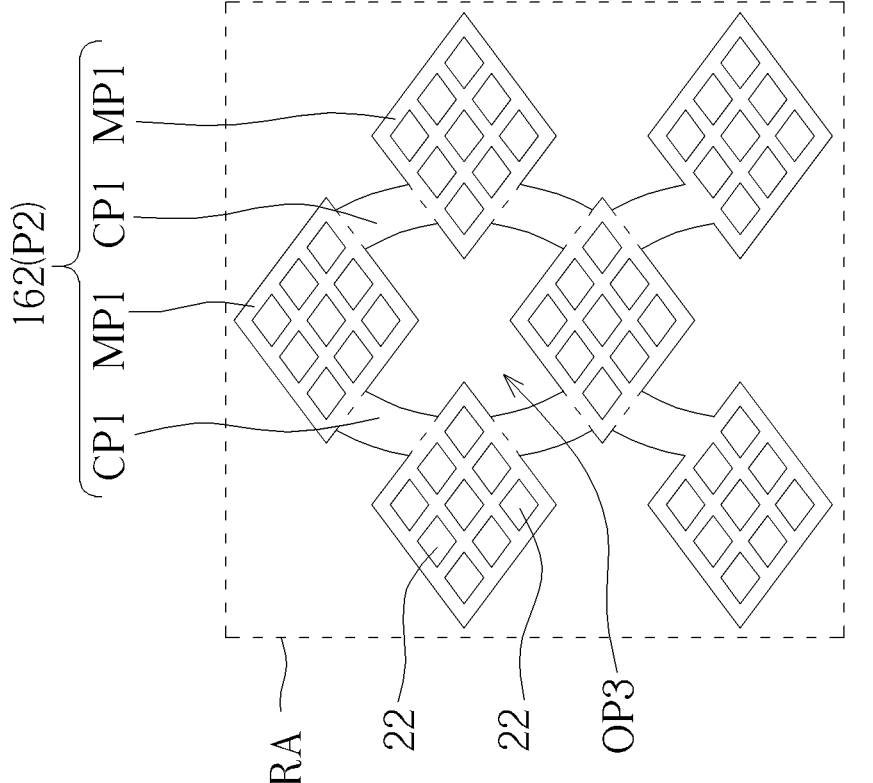

Refer to FIG. 15 and FIG. 16. FIG. 15 schematically illustrates a perspective view of an electronic device according to a sixth embodiment of the present disclosure, and FIG. 16 schematically illustrates enlarged views of parts of a flexible substrate structure corresponding to a region RA and a region RB of the electronic device 6 shown in FIG. 15. As shown in FIG. 15, the electronic device 6 may be applied to an object other than the object 10 of FIG. 1. In order to clearly show the structure of the electronic device 6, the applied object is omitted, and the flexible substrate structure 614 is as an example, but the present disclosure is not limited thereto. The electronic device 6 may have the same or similar shape as an appearance of the object which the electronic device 6 is disposed on or attached to. For example, the electronic device 6 may have the same appearance shape as the internal mechanism (e.g., the dashboard, the center console, a front pillar) in a vehicle.

In this embodiment, the flexible substrate structure 614 may be located, for example, in a space formed by a direction D3, a direction D4 and a direction D5, and the flexible substrate structure 614 may extend from top to bottom along the direction D3 and extend from right to left along the direction D4. Also, a center of a portion of the flexible substrate structure 614 extending from top to bottom may be concaved toward a direction opposite to the direction D4, and a center of another portion of the flexible substrate structure 614 extending from right to left may protrude toward a direction opposite to the direction D3. For example, the electronic device 6 may be applied to the center console (center console) of the vehicle and extend to be adjacent to the gear lever (gear lever), but not limited thereto.

As shown in FIG. 15, the flexible substrate structure 614 may include a first portion P1, a second portion P2 and a third portion P3. The second portion P2 may be disposed at a center of the flexible substrate structure 614, which is the portion concaved toward a direction opposite to the direction D4 and extending from top to bottom. The third portion P3 may be disposed at the center of the portion of the flexible substrate structure 614 that is the portion protruding toward the direction opposite to the direction D3 and extending from right to left. For example, the second portion P2 and the third portion P3 may be disposed on a central line 14L of the flexible substrate structure 614. The covering layer (e.g., the covering layer 12 of FIG. 3) of the electronic device 6 may include the region RA and the region RB, in which the region RA corresponds to the second portion P2 and may have a Gaussian curvature less than zero, and the region RB corresponds to the third portion P3 and may have a Gaussian curvature greater than zero. In the embodiment of FIG. 15, the structure of the first portion P1 of the flexible substrate structure 614 may be the same as or similar to that of the first portion P1 shown in FIG. 3, so it will not be detailed redundantly herein. For example, the Gaussian curvature of the first portion P1 may be zero.

As shown in FIG. 15 and FIG. 16, the first portion P1 may not be patterned but may have a Poisson's ratio greater than zero. The second portion P2 and the third portion P3 may be patterned, so that both the Poisson's ratios of the second portion P2 and the third portion P3 may be less than zero, which are less than the Poisson's ratio of the first portion P1. The assembly quality of disposing the second portion P2 and/or the third portion P3 on a corresponding region of the object may be improved by designing the Poisson's ratio of the second portion P2 and the third portion P3 to be less than zero.

As shown in FIG. 16, in the normal direction ND of the flexible substrate structure 614, the second substrate 162 of the second portion P2 may have a plurality of openings OP3. Specifically, the second substrate 162 may include a plurality of main portions MP1 and a plurality of connecting portions CP1, and the main portions MP1 and the connecting portions CP1 may surround and form a plurality of openings OP3. The third substrate 163 of the third portion P3 may have a plurality of openings OP6. Specifically, the third substrate 163 may include a plurality of main portions MP2 and a plurality of connecting portions CP2, and the main portions MP2 and the connecting portions CP2 may surround and form a plurality of openings OP6. Through the installation of the openings OP3, the Poisson's ratio of the second portion P2 may be less than that of the first portion P1. Through the installation of the openings OP6, the Poisson's ratio of the third portion P3 may also be less than that of the first portion P1. The size of the opening OP3 and the size of the opening OP6 may be adjusted according to the Gaussian curvature of the region RA corresponding to the second portion P2 and the Gaussian curvature of the region RB corresponding to the third portion P3. For example, when the Gaussian curvature of the region RA corresponding to the second portion P2 is less than zero, and the Gaussian curvature of the region RB corresponding to the third portion P3 is greater than zero, one of the openings OP6 may be less than one of the openings OP3 in area, but not limited thereto. In some embodiments, the shapes of the opening OP3 and the opening OP6 are mainly to enable the main portions MP1 adjacent to the opening OP3 and the main portions MP2 adjacent to the opening OP6 to move during being stretched to achieve the effect of the second substrate 162 and the third substrate 163 having the Poisson's ratio less than zero, so that the shapes of the opening OP3 and the opening OP6 may include, for example, an X shape, a polygon, the shape of the opening OP3 in FIG. 10, or other suitable shapes, but not limited thereto.

As shown in FIG. 16, each main portion MP1 of the second portion P2 may for example have a plurality of the electronic elements 22 disposed thereon. Each main portion MP2 of the third portion P3 may also have a plurality of the electronic elements 22 disposed thereon, but not limited thereto. In some embodiments, a structure of the second portion P2 located on the main portions MP1 and the connecting portions CP1 and/or a structure of the third portion P3 located on the main portions MP2 and the connecting portions CP2 may, for example, adopt the structures shown in FIG. 9 and FIG. 10, but not limited thereto. In some embodiments, the second portion P2 and/or the third portion P3 may also adopt the case of any of the above embodiments.

As mentioned above, in the electronic device of the present disclosure, when the Gaussian curvature of the first region is different from that of the second region in the covering layer, the Poisson's ratio of the first portion may be different from that of the second portion in the flexible substrate structure, which improves the assembly quality of disposing the electronic device on the object. Therefore, the wrinkles occurred on the electronic device during disposing the electronic device on the surface of the object may be reduced, or the reliability or lifetime of the electronic device may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a covering layer comprising a first region and a second region; and
a flexible substrate structure disposed under the covering layer and comprising a first portion corresponding to the first region and a second portion corresponding to the second region,
wherein an absolute value of a Gaussian curvature of the first region of the covering layer is less than an absolute value of a Gaussian curvature of the second region of the covering layer, and a Poisson's ratio of the first portion of the flexible substrate structure is greater than zero and a Poisson's ratio of the second portion of the flexible substrate structure is less than zero.

2. The electronic device as claimed in claim 1, wherein the first portion of the flexible substrate structure comprises a first substrate, the second portion of the flexible substrate structure comprises a second substrate, and the first substrate is different from the second substrate in material.

3. The electronic device as claimed in claim 2, wherein a Poisson's ratio of the first substrate is greater than a Poisson's ratio of the second substrate.

4. The electronic device as claimed in claim 3, wherein the Poisson's ratio of the first substrate is greater than zero and the Poisson's ratio of the second substrate is less than zero.

5. The electronic device as claimed in claim 1, wherein the first portion of the flexible substrate structure comprises a first substrate, the second portion of the flexible substrate structure comprises a second substrate, and the second substrate comprises a plurality of openings and a plurality of segments, each opening is disposed between two adjacent ones of the plurality of segments, and one end of one of the two adjacent ones of the plurality of segments is connected to one end of another one of the two adjacent ones of the plurality of segments.

6. The electronic device as claimed in claim 1, wherein the first portion of the flexible substrate structure comprises a first substrate having a plurality of first openings, the second portion of the flexible substrate structure comprises a second substrate having a plurality of second openings, and the plurality of first openings are less than the plurality of second openings in density.

7. The electronic device as claimed in claim 1, wherein the Gaussian curvature of the first region of the covering layer is greater than zero, the Gaussian curvature of the second region of the covering layer is less than zero, the first portion of the flexible substrate structure comprises a first substrate having a plurality of first openings, the second portion of the flexible substrate structure comprises a second substrate having a plurality of second openings, and one of the plurality of first openings is less than one of the plurality of second openings in area.

8. The electronic device as claimed in claim 1, wherein the second portion is at a corner of the flexible substrate structure.

9. The electronic device as claimed in claim 1, wherein the second portion is at a center of the flexible substrate structure.

* * * * *